United States Patent
Jin et al.

(10) Patent No.: US 11,088,185 B2
(45) Date of Patent: Aug. 10, 2021

(54) IMAGE SENSOR INCLUDING PARTICULAR READOUT CIRCUIT ARRANGEMENT

(71) Applicant: Samsung Electronics Co., Ltd., Suwon-si (KR)

(72) Inventors: Younggu Jin, Suwon-si (KR); Youngchan Kim, Seongnam-si (KR); Yonghun Kwon, Hwaseong-si (KR); Moosup Lim, Yongin-si (KR); Taesub Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/592,840

(22) Filed: Oct. 4, 2019

(65) Prior Publication Data
US 2020/0279881 A1 Sep. 3, 2020

(30) Foreign Application Priority Data

Feb. 28, 2019 (KR) ........................ 10-2019-0024003

(51) Int. Cl.
*H04N 5/374* (2011.01)
*H01L 27/146* (2006.01)
(Continued)

(52) U.S. Cl.
CPC .... *H01L 27/14603* (2013.01); *H01L 27/1463* (2013.01); *H01L 27/14601* (2013.01);
(Continued)

(58) Field of Classification Search
None
See application file for complete search history.

(56) References Cited

U.S. PATENT DOCUMENTS

2004/0125449 A1* 7/2004 Sales .................... G02B 5/3058
359/485.05
2010/0231891 A1* 9/2010 Mase .................... G01S 17/894
356/5.01

(Continued)

FOREIGN PATENT DOCUMENTS

JP 5541653 B2 7/2014
JP 2017-017563 A 1/2017
(Continued)

OTHER PUBLICATIONS

Kadambi et al., "Polarized 3D: High-Quality Depth Sensing with Polarization Cues", ICCV 2015.

*Primary Examiner* — Twyler L Haskins
*Assistant Examiner* — Wesley J Chiu
(74) *Attorney, Agent, or Firm* — Muir Patent Law, PLLC

(57) ABSTRACT

An image sensor includes a polarizer array and a depth pixel array. The polarizer array may include first to fourth unit pixels, which are arranged in a first direction and a second direction crossing each other, and may include polarization gratings respectively provided in the first to fourth unit pixels. The polarization gratings of the first to fourth unit pixels may have polarization directions different from each other. The depth pixel array may include depth pixels corresponding to the first to fourth unit pixels, respectively. Each of the depth pixels may include a photoelectric conversion device and first and second readout circuits, which are connected in common to the photoelectric conversion device.

9 Claims, 22 Drawing Sheets

(51) Int. Cl.
  *H04N 5/378* (2011.01)
  *H04N 5/3745* (2011.01)
  *H04N 5/225* (2006.01)
  *G06T 7/50* (2017.01)

(52) U.S. Cl.
  CPC .. *H01L 27/14627* (2013.01); *H01L 27/14641* (2013.01); *H01L 27/14645* (2013.01); *H04N 5/378* (2013.01); *H04N 5/37452* (2013.01); *G06T 7/50* (2017.01); *H04N 5/2254* (2013.01)

(56) References Cited

U.S. PATENT DOCUMENTS

| | | | |
|---|---|---|---|
| 2014/0198183 A1* | 7/2014 | Kim | G01S 17/894 |
| | | | 348/46 |
| 2016/0261852 A1 | 9/2016 | Hirasawa | |
| 2017/0078640 A1 | 3/2017 | Otani | |
| 2018/0075615 A1 | 3/2018 | Myokan et al. | |
| 2018/0213170 A1* | 7/2018 | Segawa | H04N 13/239 |
| 2019/0371839 A1* | 12/2019 | Sato | H04N 5/363 |
| 2019/0385006 A1* | 12/2019 | Kashitani | H04N 5/369 |
| 2020/0028017 A1* | 1/2020 | Imoto | G01S 17/32 |
| 2020/0103511 A1 | 4/2020 | Jin et al. | |
| 2020/0152683 A1* | 5/2020 | Akiyama | H04N 5/369 |
| 2020/0203416 A1* | 6/2020 | Jin | H01L 27/14603 |
| 2020/0286942 A1* | 9/2020 | Jin | H01L 31/02327 |

FOREIGN PATENT DOCUMENTS

| | | |
|---|---|---|
| KR | 10-1391183 B1 | 5/2014 |
| KR | 10-1424665 B1 | 8/2014 |
| KR | 10-1922046 B1 | 11/2018 |

* cited by examiner though not expressly stated in any written description, the claims appended to this application.

IMAGE SENSOR INCLUDING PARTICULAR READOUT CIRCUIT ARRANGEMENT

CROSS-REFERENCE TO RELATED APPLICATIONS

This U.S. non-provisional patent application claims priority under 35 U.S.C. § 119 to Korean Patent Application No. 10-2019-0024003, filed on Feb. 28, 2019 in the Korean Intellectual Property Office, and the entire contents of which are hereby incorporated by reference.

BACKGROUND

The present disclosure relates to an image sensor, and in particular, to an image sensor capable of realizing a three-dimensional image.

An image sensor is an electronic device that converts optical images into electrical signals. With the recent development of the computer and communication industries, there is an increased demand for high-performance image sensors in a variety of applications such as digital cameras, camcorders, personal communication systems, gaming machines, security cameras, micro-cameras for medical applications, and/or robots. In addition, image sensors for realizing three-dimensional and/or color images are recently being developed.

SUMMARY

An embodiment of the inventive concept provides an image sensor configured to easily obtain signals, which contain information on a polarization state and depth to an object, from light emitted toward and reflected from the object.

According to an embodiment of the inventive concept, an image sensor may include a polarizer array including first to fourth unit pixels, which are arranged in a first direction and a second direction crossing each other, the polarizer array including polarization gratings respectively provided in the first to fourth unit pixels. The polarization gratings of the first to fourth unit pixels have polarization directions different from each other. The image sensor further includes a depth pixel array including depth pixels corresponding to the first to fourth unit pixels, respectively. Each of the depth pixels may include a photoelectric conversion device and first and second readout circuits, which are connected in common to the photoelectric conversion device.

According to an embodiment of the inventive concept, an image sensor may include a semiconductor substrate having a first surface and a second surface opposite to each other and including a plurality of pixel regions, photoelectric conversion regions in the pixel regions, respectively, of the semiconductor substrate, first and second readout circuits on the first surface of the semiconductor substrate in each of the pixel regions, and a polarizer array on the second surface of the semiconductor substrate. The polarizer array may include polarization gratings respectively provided in the pixel regions. The polarization gratings of the pixel regions may have polarization directions different from each other.

According to an embodiment of the inventive concept, an image sensor may include a polarizer array including first to fourth unit pixels, which are two-dimensionally arranged, and including polarization gratings, which are respectively provided in the first to fourth unit pixels and have polarization directions different from each other, a depth pixel array including depth pixels corresponding to the first to fourth unit pixels, respectively, each of the depth pixels including a photoelectric conversion device and first to fourth readout circuits connected to the photoelectric conversion device, and a micro lens array including micro lenses corresponding to the first to fourth unit pixels, respectively. The polarizer array may be disposed between the micro lens array and the depth pixel array.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Image sensing may use time of flight (ToF) image sensors and polarization sensors. A conventional technology of combining images obtained from a ToF sensor and a polarization sensor has been suggested to provide a precise depth map. However, this technology uses two cameras, and since two cameras are needed for such a technology, an overall size of the system is increased. In addition, for such technology, for an image matching, it may be necessary to calibrate the two cameras. Therefore, certain examples are discussed below to address these issues.

Figure 1:
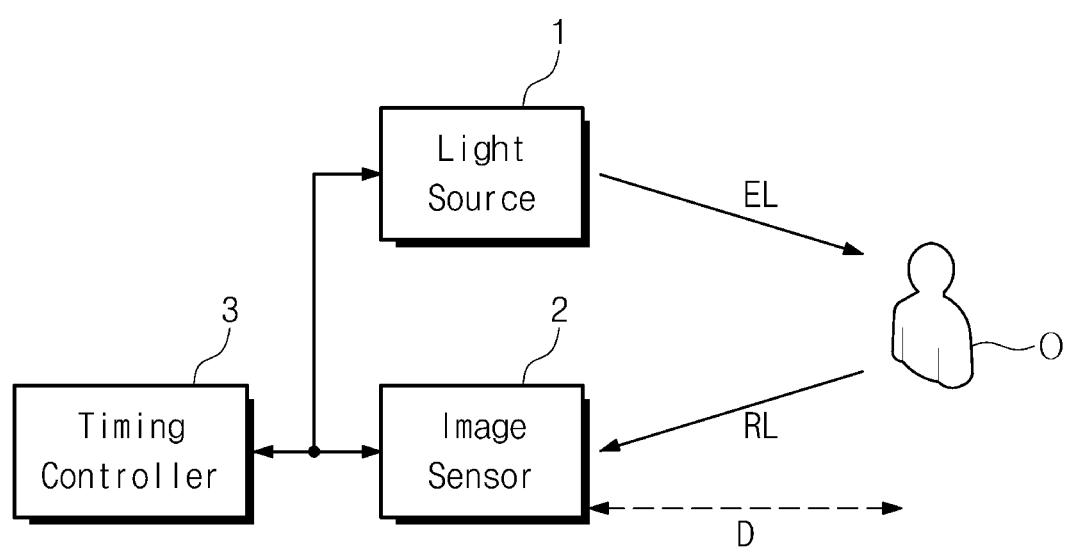
FIG. 1 is a diagram schematically illustrating an image sensor system according to an embodiment of the inventive concept.

FIG. 1 is a diagram schematically illustrating an image sensor system according to an embodiment of the inventive concept.

Referring to FIG. 1, an image sensor system according to an embodiment of the inventive concept is configured to emit light toward an object O, to sense light reflected from the object O, and to calculate an optical depth or distance D to the object O. The image sensor system may include a light source 1 emitting the light toward the object O, an image sensor 2 sensing light reflected from the object O, and a timing controller 3 providing a synchronized pulse to the light source 1 and the image sensor 2.

The light source 1 is configured to emit an optical signal EL, which is provided as a pulsed wave, toward the object O. In an embodiment, the light source 1 may be configured to emit infrared, microwave, or visible light. For example, a light generator, such as a light emitting diode (LED), a laser diode (LD) or an organic light emitting diode (OLED) may be used for the light source 1.

The image sensor 2 is formed to sense light RL reflected from the object O and to output information on an optical depth to the object O. The optical depth information obtained by the image sensor 2 may be used to estimate a three-dimensional image, as in an infrared camera. Furthermore, the image sensor 2 may include depth pixels and visible light pixels, and in this case, three-dimensional color images may be realized.

The timing controller 3 may control operations of the light source 1 and the image sensor 2. For example, the timing controller 3 may be configured to synchronize a light emitting operation of the light source 1 with a light-receiving operation of the image sensor 2.

Figure 2:
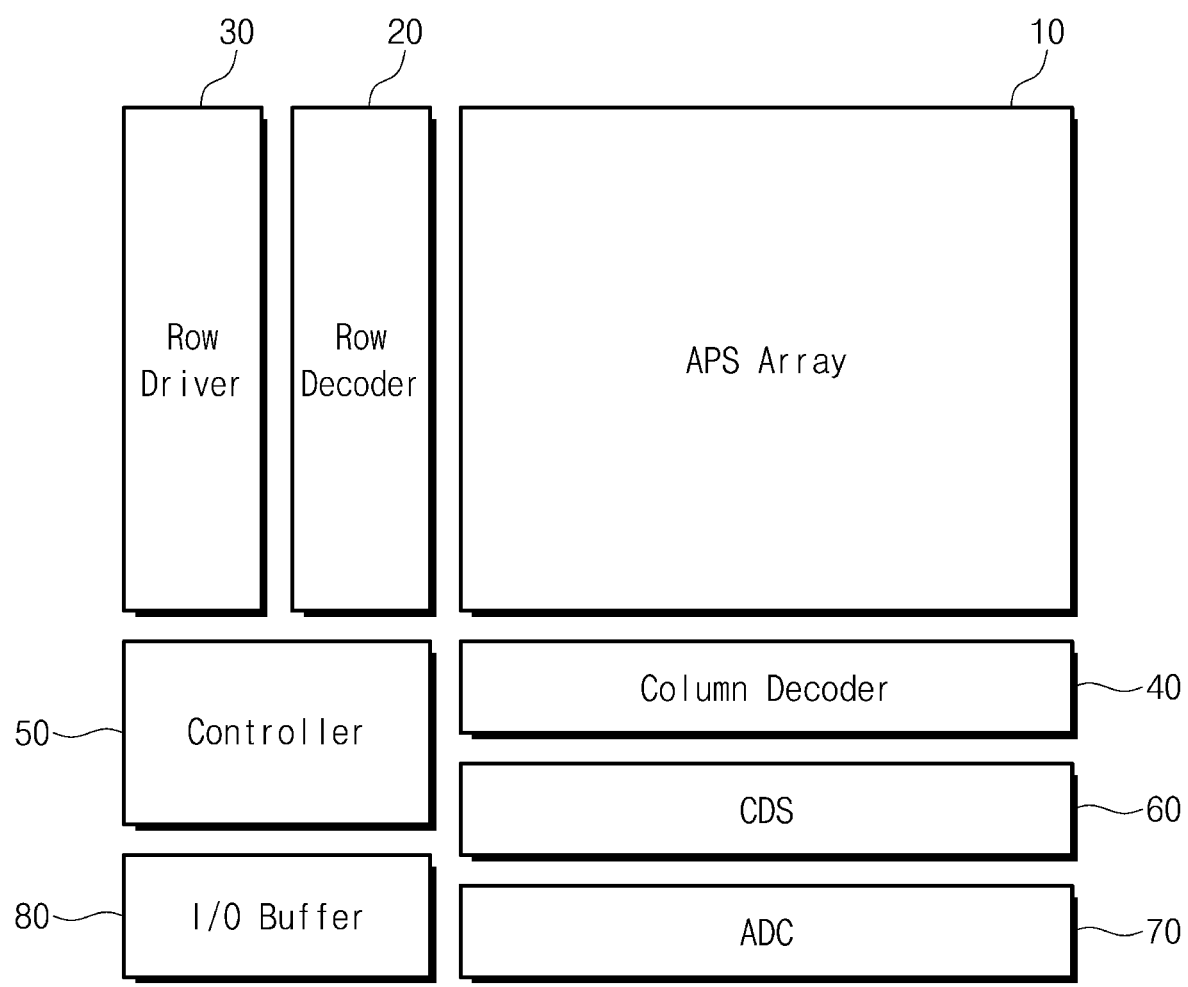
FIG. 2 is a block diagram illustrating an image sensor according to an embodiment of the inventive concept.

FIG. 2 is a block diagram illustrating an image sensor according to an embodiment of the inventive concept.

Referring to FIG. 2, the image sensor may include an active pixel sensor array 10, a row decoder 20, a row driver 30, a column decoder 40, a controller 50, a correlated double sampler (CDS) 60, an analog-to-digital converter (ADC) 70, and an input/output buffer (I/O buffer) 80.

The active pixel sensor array 10 includes a plurality of unit pixels, which are two-dimensionally arranged, and may be used to convert optical signals to electrical signals. The active pixel sensor array 10 is driven by a plurality of driving signals (e.g., pixel-selection, reset, and charge-transfer signals), which are transmitted from the row driver 30. The electrical signals converted by the active pixel sensor array 10 may be provided to the correlated double sampler 60.

The row driver 30 is configured to generate driving signals for driving the unit pixels, based on information decoded by the row decoder 20, and then to transmit the driving signals to the active pixel sensor array 10. When the unit pixels are arranged in a matrix form (i.e., in rows and columns), the driving signals may be provided to respective rows.

The controller 50 controls an overall operation of the image sensor and provides timing and control signals to the row decoder 20 and the column decoder 40.

The CDS 60 is configured to receive the electric signals generated by the active pixel sensor array 10 and then to perform an operation of holding and sampling the received electric signals. For example, the CDS 60 may perform a double sampling operation on a specific noise level and a signal level of the electric signal and then may output a difference level corresponding to a difference between the noise and signal levels.

The ADC 70 is configured to convert an analog signal, which contains information on the difference level outputted from the CDS 60, to a digital signal and then to output the digital signal.

The I/O buffer 80 is configured to latch the digital signals and then to output the latched digital signals to an image signal processing unit (not shown) sequentially, based on information decoded by the column decoder 40.

Figure 3:
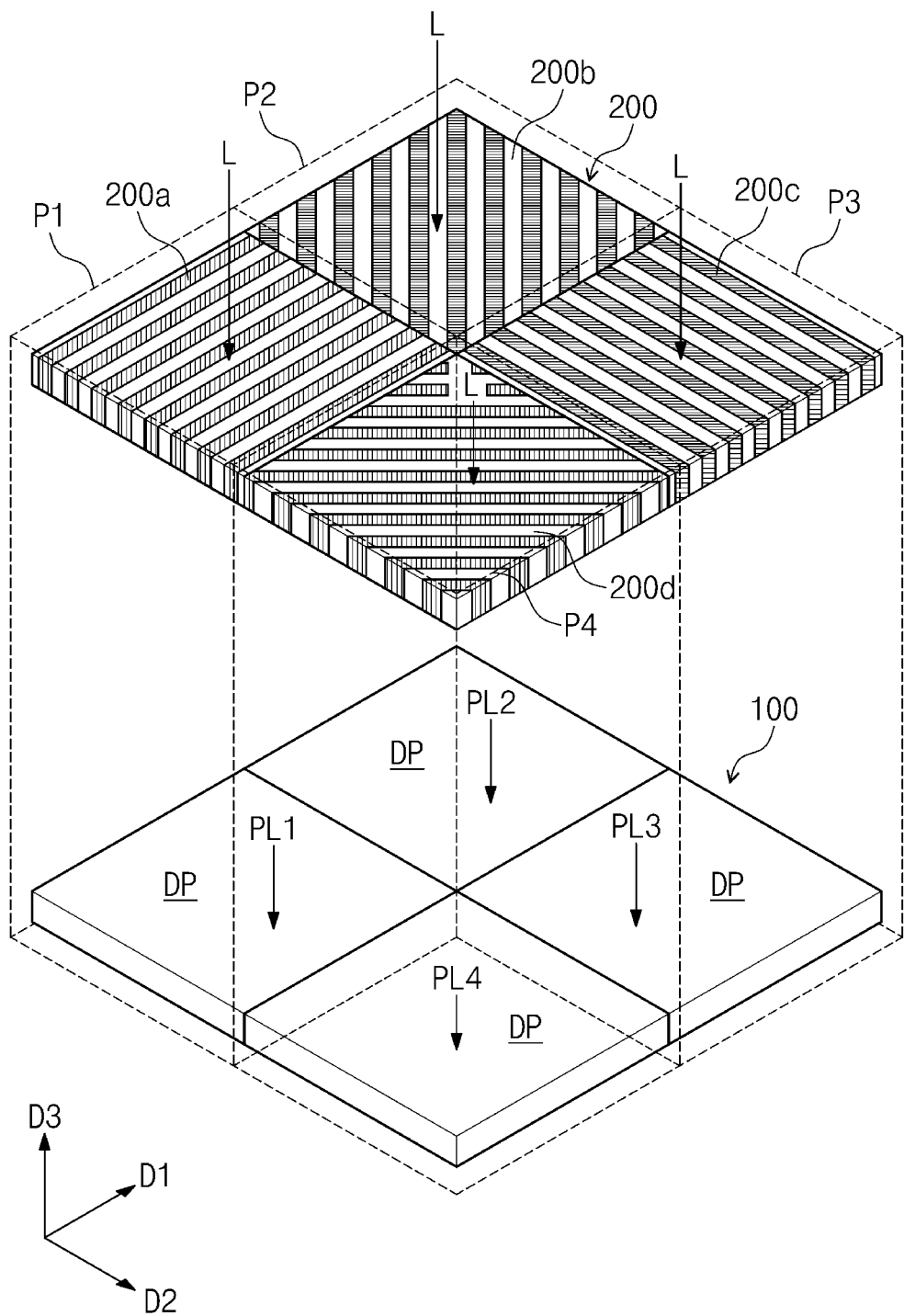
FIG. 3 is a block diagram schematically illustrating an active pixel sensor array of an image sensor according to an embodiment of the inventive concept.

FIG. 3 is a block diagram schematically illustrating an active pixel sensor array of an image sensor according to an embodiment of the inventive concept.

Referring to FIG. 3, the active pixel sensor array 10 includes a plurality of unit pixels P1-P4, which are two-dimensionally arranged in a first direction D1 and a second direction D2 crossing each other. As an example, the active pixel sensor array 10 may include first to fourth unit pixels P1-P4, which are sequentially arranged in a clockwise direction. A unit pixel, as used herein, may refer to an individual sensor element of an image sensor, and may refer to a smallest addressable light-sensing element of the image sensor.

The active pixel sensor array 10 may include a depth pixel array 100 and a polarizer array 200, which are stacked in a third direction D3 perpendicular to the first and second directions D1 and D2.

The depth pixel array 100 may include a plurality of depth pixels DP, which are two-dimensionally arranged in the first and second directions D1 and D2. The depth pixels DP may sense an incident light and may output information on an optical depth to an object O. Each of the depth pixels DP may include a photoelectric conversion device and a plurality of transistors for processing signals.

The polarizer array 200 may include first to fourth polarization gratings 200a-200d, which are disposed in the first to fourth unit pixels P1-P4, respectively. The first to fourth polarization gratings 200a-200d may have polarization directions different from each other.

In an embodiment, the first polarization gratings 200a may be arranged parallel to the first direction D1, the second polarization gratings 200b may be arranged to extend in a direction at an angle of 45° relative to the first direction D1, the third polarization gratings 200c may be arranged to extend in a direction at an angle of 90° relative to the first direction D1 (i.e., parallel to the second direction D2), and the fourth polarization gratings 200d may be arranged to extend in a direction at an angle of 135° relative to the first direction D1 (which may also be described as being arranged to extend in a direction at an angle of 45° relative to the first direction D1 and 90° relative to the direction in which the second polarization gratings 200b extend).

If light L (i.e., the reflection light RL of FIG. 1) is incident into the active pixel sensor array 10, the light L may be polarized by the first to fourth polarization gratings 200a-200d in the first to fourth unit pixels P1-P4, thereby forming polarized lights PL1-PL4, which are incident into the depth pixel array 100.

If the light L is incident into the unit pixels P1-P4, each polarization grating 200a-200d may allow a fraction of the light L having a specific polarization component to be selectively incident onto a corresponding one of the depth pixels DP. In detail, the light L passing through the first polarization gratings 200a of the first unit pixel P1 may form a first polarized light PL1, which has a first polarization component and is incident onto the depth pixel DP of the first unit pixel P1. The light L passing through the second polarization gratings 200b of the second unit pixel P2 may form a second polarized light PL2, which has a second polarization component and is incident onto the depth pixel DP of the second unit pixel P2. The light L passing through the third polarization gratings 200c of the third unit pixel P3 may form a third polarized light PL3, which has a third polarization component and is incident to the depth pixel DP of the third unit pixel P3. The light L passing through the fourth polarization gratings 200d of the fourth unit pixel P4 may form a fourth polarized light PL4, which has a fourth polarization component and is incident onto the depth pixel DP of the fourth unit pixel P4.

The lights PL1-PL4 passing through the polarizer array 200 may have different intensities from each other, in the first to fourth unit pixels P1-P4. In an embodiment, in the depth pixel DP of each of the first to fourth unit pixels, a time of flight for each of the first to fourth polarized lights PL1-PL4 may be calculated.

In an embodiment, the first to fourth unit pixels P1-P4 including the first to fourth polarization gratings 200a-200d may constitute a single optical sensor block. Signals obtained from the optical sensor block composed of the first to fourth unit pixels P1-P4 may be analyzed to calculate a degree of polarization and direction of the incident light L (i.e., the reflection light RL of FIG. 1).

Figure 4:
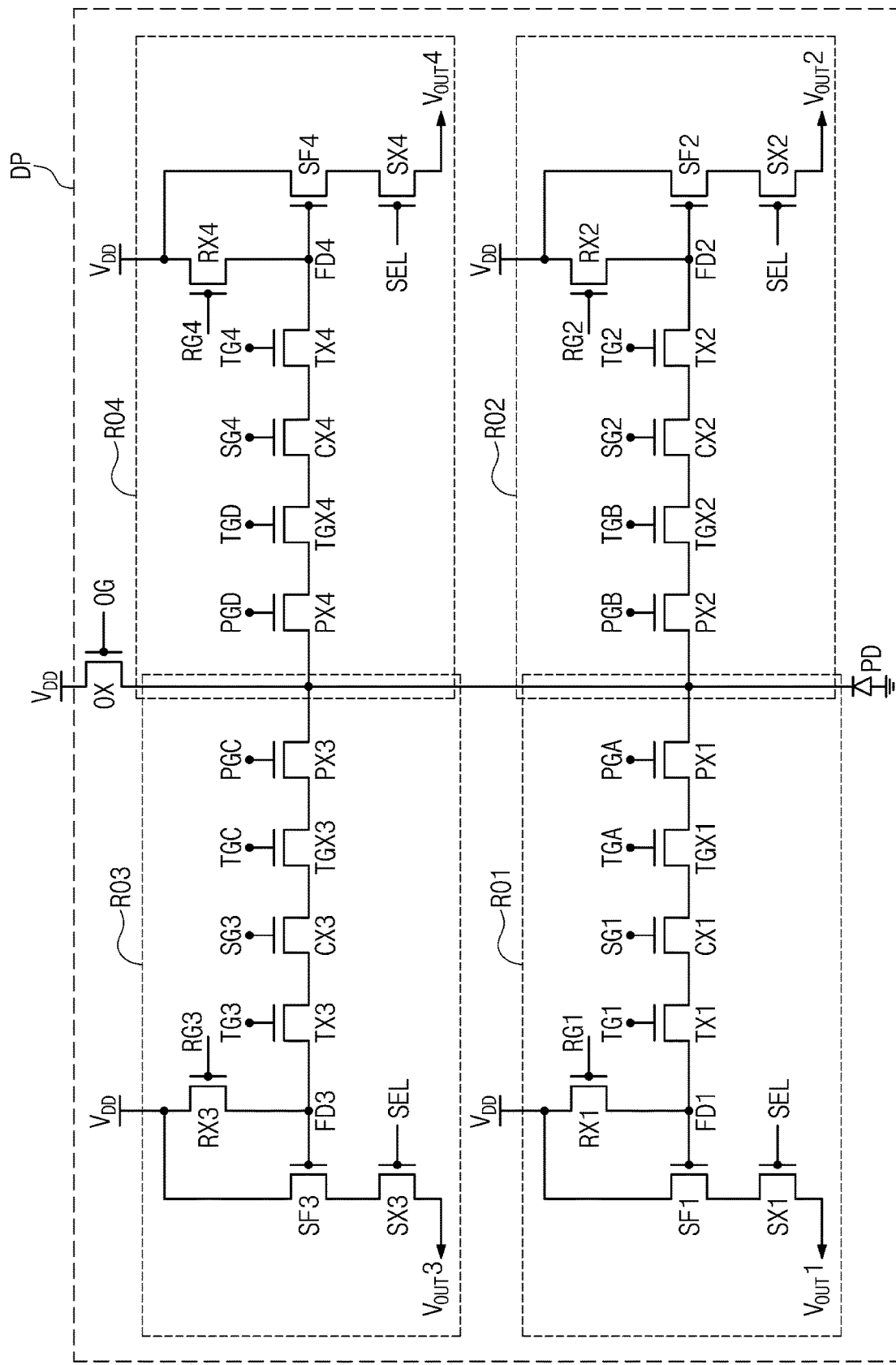
FIG. 4 is a circuit diagram illustrating a depth pixel of a 4-tap structure, which is provided in a depth pixel array according to an embodiment of the inventive concept.

FIG. 4 is a circuit diagram illustrating a depth pixel of a 4-tap structure, which is provided in a depth pixel array according to an embodiment of the inventive concept.

Referring to FIG. 4, the depth pixel of the 4-tap structure DP may include a photoelectric conversion device PD, first to fourth readout circuits RO1-RO4, and an overflow transistor OX.

In the depth pixel DP, the first to fourth readout circuits RO1-RO4 may share one photoelectric conversion device PD and one overflow transistor OX. For example, one photoelectric conversion device PD may be electrically connected in common to the first to fourth readout circuits RO1-RO4.

The photoelectric conversion device PD may generate and store electric charges from light incident thereto. The light incident into the depth pixel DP may be the polarized lights PL1-PL4 provided through the polarizer array 200, as described with reference to FIG. 3. The photoelectric conversion device PD may be provided in the form of a photo diode, a phototransistor, a photogate, a pinned photo diode, or any combination thereof. For the sake of simplicity, the description that follows will refer to an example in which a photo diode is used as the photoelectric conversion device PD.

In an embodiment, each of the first to fourth readout circuits RO1-RO4 may include a floating diffusion node FD1, FD2, FD3, or FD4 and a phototransistor PX1, PX2, PX3, or PX4, which is connected to the floating diffusion node FD1, FD2, FD3, or FD4 and the photoelectric conversion device PD. Furthermore, each of the first to fourth readout circuits RO1-RO4 may further include a capture transistor TGX1, TGX2, TGX3, or TGX4, a storage transistor CX1, CX2, CX3, or CX4, and a transfer transistor TX1, TX2, TX3, or TX4, which are disposed between the floating diffusion node FD1, FD2, FD3, or FD4 and the phototransistor PX1, PX2, PX3, or PX4.

Electric charges generated in the photoelectric conversion device PD may be transferred to the floating diffusion node FD1-FD4 through the phototransistor PX1-PX4, the capture transistor TGX1-TGX4, the storage transistor CX1-CX4, and the transfer transistor TX1-TX4.

In detail, the phototransistors PX1-PX4 may be controlled by photogate signals PGA-PGD, and the photogate signals PGA-PGD (applied to photogates of the phototransistors PX1-PX4) for the first to fourth readout circuits RO1-RO4 may have phases different from each other. The capture transistors TGX1-TGX4 may be controlled by capture signals TGA-TGD (applied to capture gates of the capture transistors TGX1-TGX4), respectively. The capture transistors TGX1-TGX4 may store electric charges therein or may transfer electric charges to the storage transistors CX1-CX4, respectively, in response to the capture signals TGA-TGD. The storage transistors CX1-CX4 may store electric charges therein or may transfer electric charges to the transfer transistors TX1-TX4, respectively, in response to storage control signals SG1-SG4 (applied to storage gates of the storage transistors CX1-CX4). The transfer transistor TX1-TX4 may be connected between a drain of the phototransistor PX1-PX4 and a gate of an amplification transistor SF1-SF4. The transfer transistors TX1-TX4 may be controlled by transfer signals TG1-TG4 (applied to transfer gates of transfer transistors TX1-TX4), respectively. The above descriptions of connections between transfers refers to electrical connections, and may also refer to physical layout connections.

Although not illustrated in the drawings, in an embodiment, a storage diode, which is connected between the storage transistor CX1-CX4 and the transfer transistor TX1-TX4, may be provided in each readout circuit RO1-RO4. The storage diodes may have a structure similar to the photoelectric conversion device PD (i.e., an impurity region doped to have a conductivity type different from a semiconductor substrate) or may be provided in the form of a capacitor.

In each readout circuit RO1-RO4, if the phototransistor PX1-PX4 is turned on, photocharges may be generated in the photoelectric conversion device PD, and such photocharges may be transferred to and stored in the floating diffusion node FD1-FD4 when the transfer transistor TX1-TX4 is turned on.

In each of the first to fourth readout circuits RO1-RO4, the electric charges stored may be periodically discharged from the floating diffusion node FD1-FD4 through a reset transistor RX1, RX2, RX3, or RX4, such that the floating diffusion nodes FD1-FD4 are reset. In each readout circuit RO1-RO4, the reset transistor RX1-RX4 may include a source connected to the floating diffusion node FD1-FD4 and a drain connected to the power voltage VDD.

The electric charges may be accumulated in the floating diffusion node FD1-FD4 of each readout circuit RO1-RO4, and the amplification transistor SF1-SF4 may be controlled by an amount of the electric charges accumulated in the floating diffusion node FD1-FD4. The amplification transistor SF1-SF4 may be a source-follower-buffer amplifier, whose source-drain current is controlled by an electric potential of its gate electrode.

In each of the first to fourth readout circuits RO1-RO4, a signal proportional to an electric potential at the floating diffusion node FD1-FD4 may be amplified by the amplification transistor SF1-SF4, and the amplified signal may be output to an output line VOUT1-VOUT4 through a selection transistor SX1-SX4.

The phototransistors PX1-PX4 of the first to fourth readout circuits RO1-RO4 may be controlled by the photogate signals PGA-PGD whose phases are different from each other. Owing to the difference in phase between the photogate signals PGA-PGD, different signals may be output through the first to fourth output lines $V_{OUT1}$-$V_{OUT4}$.

In each depth pixel DP, the overflow transistor OX may be controlled by an overflow control signal OG. The overflow transistor OX may be turned on, when the first to fourth transfer transistors TX1-TX4 are turned off. When the first to fourth transfer transistors TX1-TX4 are turned off, photocharges produced in the photoelectric conversion device PD may be discharged through the overflow transistor OX. The overflow transistor OX may prevent electric charges, which are produced in the photoelectric conversion region PD, from being overflown to the first to fourth floating diffusion nodes FD1-FD4, during an operation of detecting photocharges in the first to fourth floating diffusion nodes FD1-FD4.

In an embodiment, the capture transistors TGX1-TGX4, the storage transistors CX1-CX4, the transfer transistors TX1-TX4, and the overflow transistor OX may be omitted from the first to fourth readout circuits RO1-RO4, unlike the embodiment shown in FIG. 4.

Figure 5:
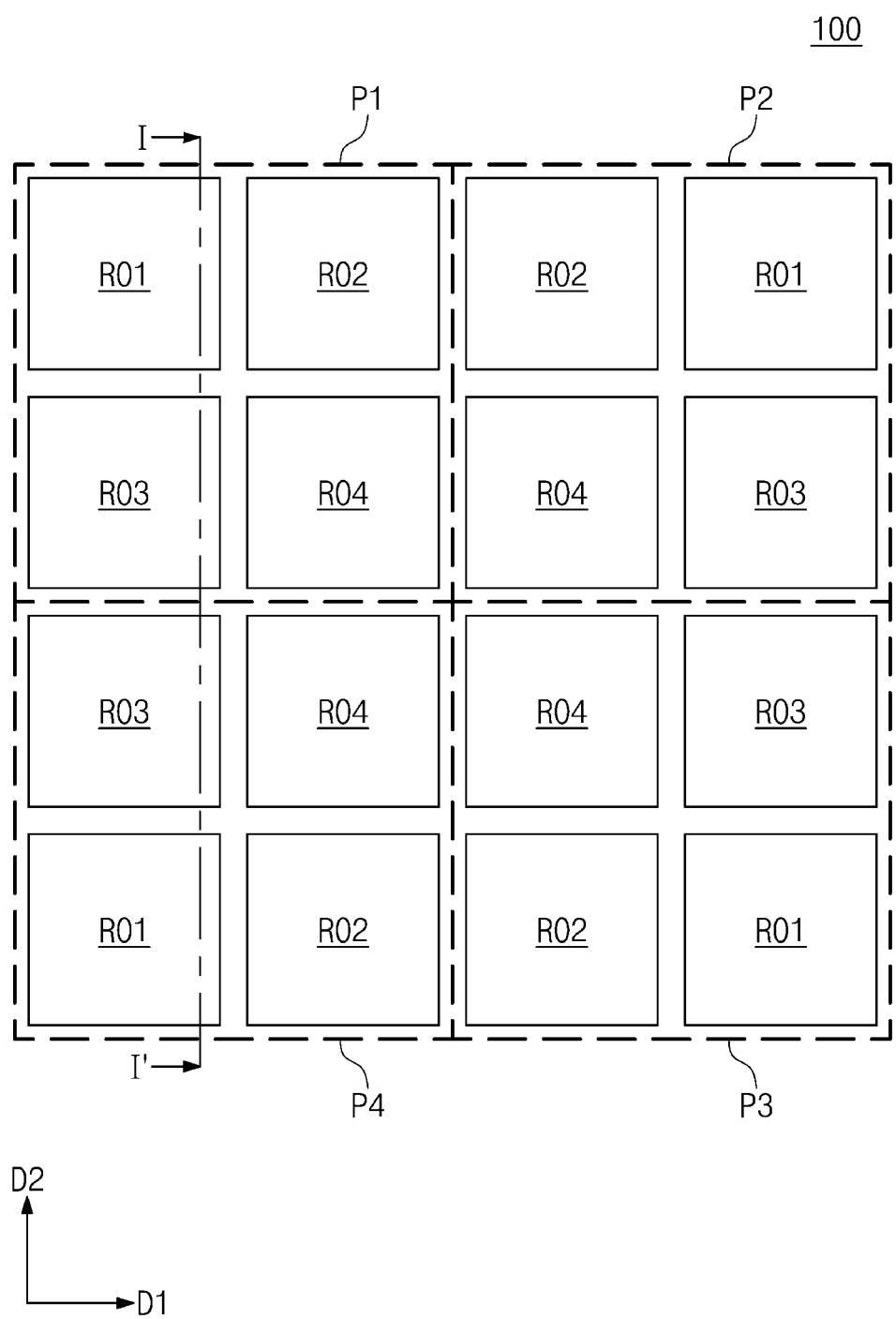
FIG. 5 is a schematic plan view illustrating a depth pixel array of an image sensor according to an embodiment of the inventive concept.
Figure 6:
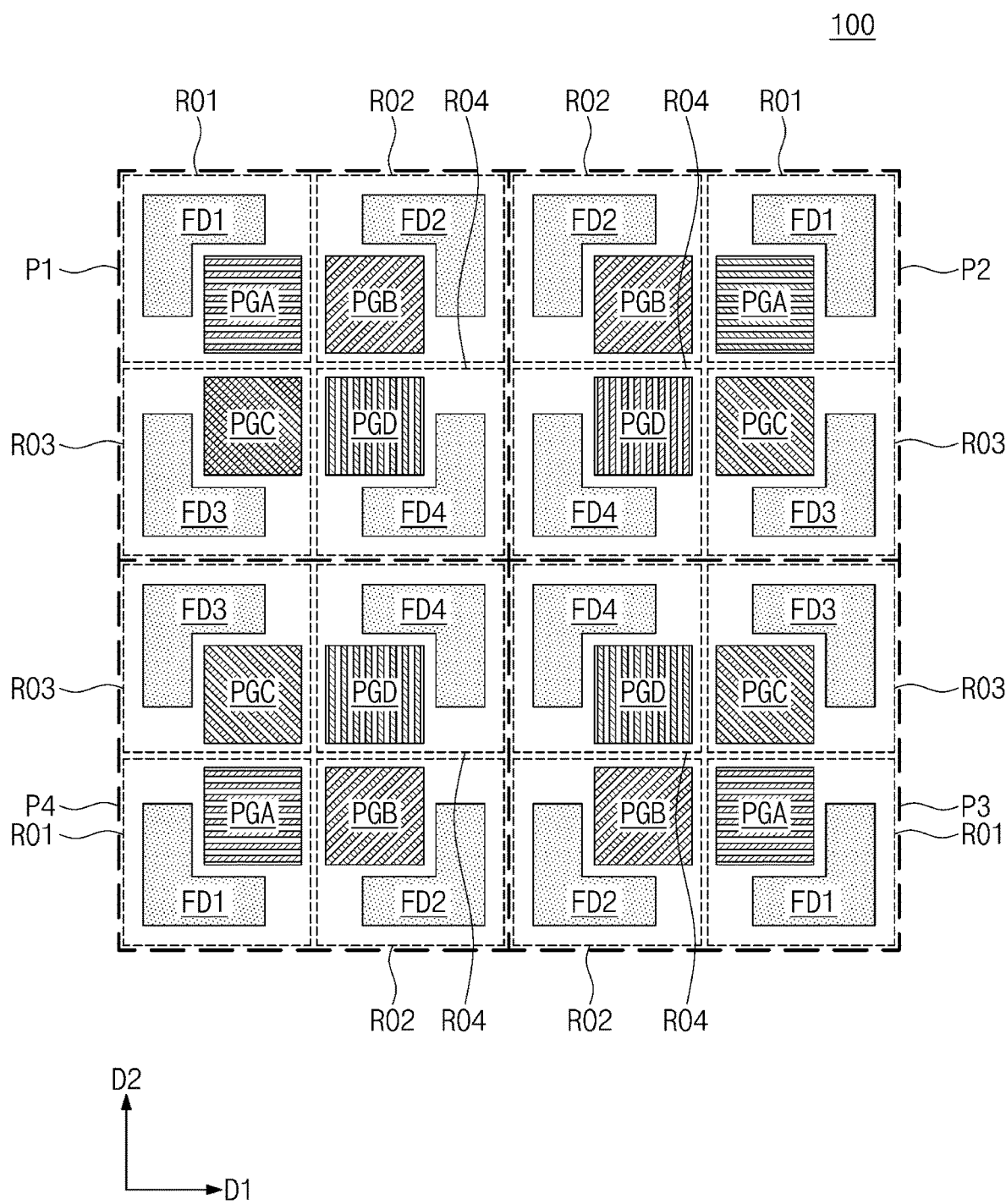
FIG. 6 is a plan view illustrating a depth pixel array of an image sensor according to an embodiment of the inventive concept.
Figure 7:
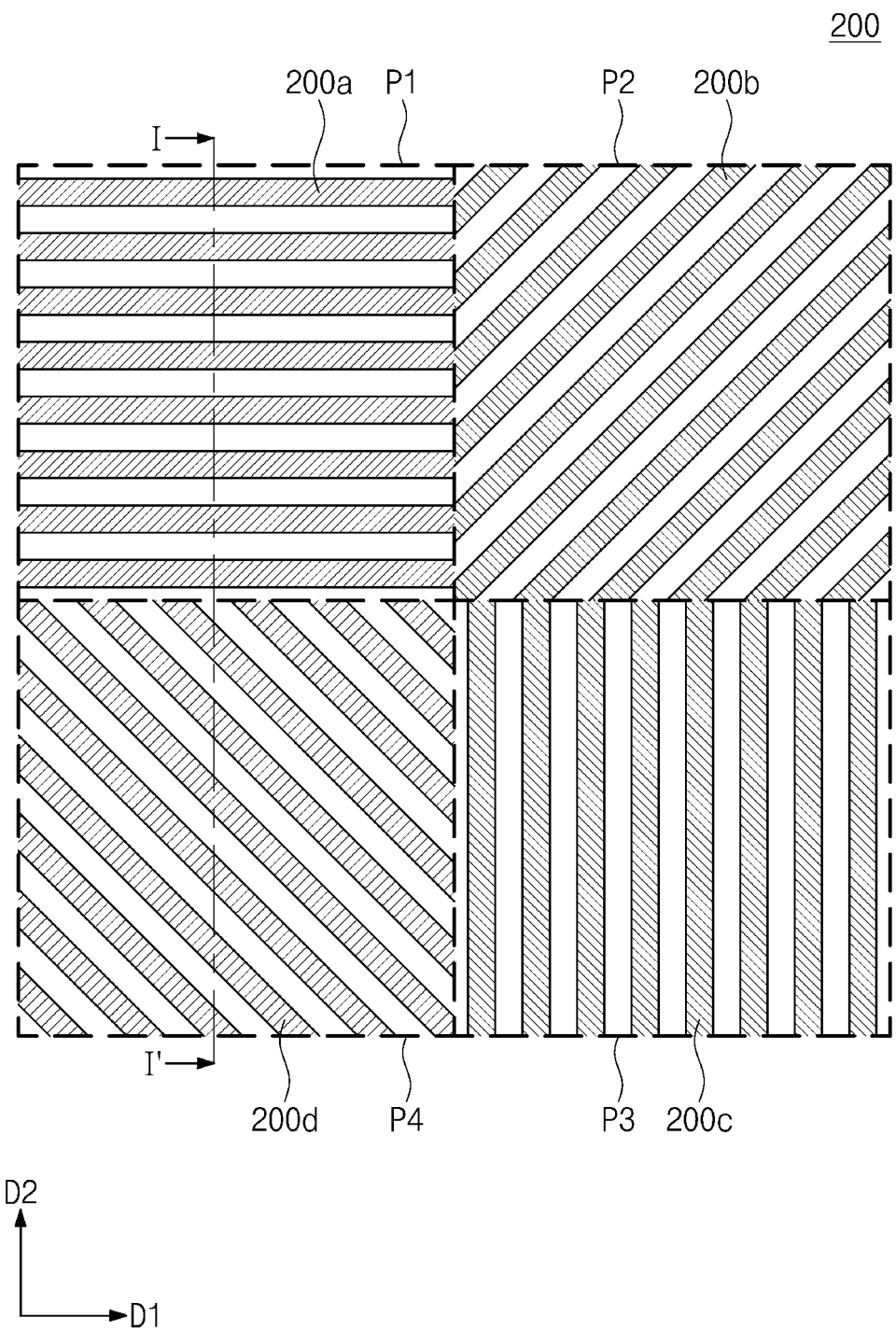
FIG. 7 is a plan view illustrating a polarizer array of an image sensor according to an embodiment of the inventive concept.

FIG. 5 is a schematic plan view illustrating a depth pixel array of an image sensor according to an embodiment of the inventive concept. FIG. 6 is a plan view illustrating a depth pixel array of an image sensor according to an embodiment of the inventive concept. FIG. 7 is a plan view illustrating a polarizer array of an image sensor according to an embodiment of the inventive concept.

Referring to FIGS. 5, 6, and 7, the depth pixel array 100 may include a plurality of unit pixels P1-P4, which are arranged in each of two orthogonal directions (e.g., the first and second directions D1 and D2). The unit pixels P1-P4 may include the first and second unit pixels P1 and P2 adjacent to each other in the first direction D1, the third unit pixel P3 adjacent to the second unit pixel P2 in the second direction D2, and the fourth unit pixel P4 adjacent to the first unit pixel P1 in the second direction D2. The first to fourth unit pixels P1-P4 may be sequentially arranged in a clockwise direction.

Referring to FIGS. 5 and 6, in each of the first to fourth unit pixels P1-P4, the depth pixel may include the first to fourth readout circuits RO1-RO4 described with reference to FIG. 4. In each depth pixel, the first to fourth readout circuits RO1-RO4 may share the photoelectric conversion device PD and the overflow transistor OX described with reference to FIG. 4 and may include the transistors described with reference to FIG. 4.

According to an embodiment of the inventive concept, in the depth pixel array 100, the first and second unit pixels P1 and P2 (and thus the layouts of the first to fourth readout circuits RO1-RO4 for the first and second unit pixels P1 and P2, and the circuit elements of the first to fourth readout circuits RO1-RO4 for the first and second unit pixels P1 and P2) are disposed in a mirror-symmetric manner with respect to a line parallel to the second direction D2, and the third and fourth unit pixels P3 and P4 (and thus the layouts of the first to fourth readout circuits RO1-RO4 for the third and fourth unit pixels P3 and P4, and the circuit elements of the first to fourth readout circuits RO1-RO4 for the third and fourth unit pixels P3 and P4) are also disposed in a mirror-symmetric manner with respect to the line parallel to the second direction D2. In addition, the first and fourth unit pixels P1 and P4 (and thus the layouts of the first to fourth readout circuits RO1-RO4 for the first and fourth unit pixels P1 and P4, and the circuit elements of the first to fourth readout circuits RO1-RO4 for the first and fourth unit pixels P1 and P4) may be disposed in a mirror-symmetric manner with respect to a line parallel to the first direction D1, and the second and third unit pixels P2 and P3 (and thus the layouts of the first to fourth readout circuits RO1-RO4 for the second and third unit pixels P2 and P3, and the circuit elements of the first to fourth readout circuits RO1-RO4 for the second and third unit pixels P2 and P3) may be disposed in a mirror-symmetric manner with respect to the line parallel to the first direction D1. For example, the fourth readout circuits RO4 of the first to fourth unit pixels P1-P4 may be arranged to be adjacent to each other in the first direction D1 and the second direction D2.

In an embodiment, as shown in FIG. 6, the first to fourth readout circuits RO1-RO4 of the first to fourth unit pixels P1-P4 may include first to fourth photogate electrodes PGA-PGD and first to fourth floating diffusion nodes FD1-FD4, respectively. In FIG. 6, each readout circuit RO1-RO4 is illustrated to include the photogate electrode PGA-PGD and the floating diffusion node FD1-FD4, but the inventive concept is not limited to this example. For example, a plurality of gate electrodes may be further disposed between the photogate electrode PGA-PGD and the floating diffusion node FD1-FD4.

In each of the first to fourth unit pixels P1-P4, the first to fourth photogate electrodes PGA-PGD may be arranged to be adjacent to each other in the first and second directions D1 and D2.

For example, the photogate electrodes PGA and PGB and the floating diffusion nodes FD1 and FD2 of the first and second readout circuits RO1 and RO2 may be disposed in a mirror-symmetric manner with respect to a line parallel to the second direction D2. The photogate electrodes PGC and PGD and the floating diffusion nodes FD3 and FD4 of the third and fourth readout circuits RO3 and RO4 may be disposed in a mirror-symmetric manner with respect to the line parallel to the second direction D2. In addition, the photogate electrodes PGA and PGB and the floating diffusion nodes FD1 and FD2 of the first and second readout circuits RO1 and RO2 and the photogate electrodes PGC and PGD and the floating diffusion nodes FD3 and FD4 of the third and fourth readout circuits RO3 and RO4 may be disposed in a mirror-symmetric manner with respect to a line parallel to the first direction D1.

Furthermore, owing to the symmetric arrangement of the depth pixels of the first to fourth unit pixels P1-P4 described above, the fourth floating diffusion nodes FD4 of the first to fourth unit pixels P1-P4 may be disposed to be adjacent to each other in the first and second directions D1 and D2.

In an embodiment, the first to fourth unit pixels P1-P4, which are arranged as shown in FIGS. 5 and 6, may constitute a single block, and a plurality of blocks may be regularly arranged in the first direction D1 and the second direction D2. Each block of unit pixels in this embodiment, also referred to as a unit pixel block, or single unit pixel block, includes the same number and layout of unit pixels, arranged in the manner shown in FIGS. 5 and 6.

Referring to FIG. 7, the polarizer array 200 may include polarization gratings 200a, 200b, 200c, and 200d having four different polarization directions of 0°, 45°, 90°, and 135° (e.g., with respect to the D1 direction extending toward the right). In certain embodiments, the polarizer array 200 may include polarization gratings having two different polarization directions of 0° and 90°.

The first polarization gratings 200a may be provided in the first unit pixel P1, and the first polarization gratings 200a may be line patterns extending parallel to the first direction D1. The second polarization gratings 200b may be provided in the second unit pixel P2, and the second polarization gratings 200b may be line patterns extending in a direction at an angle of 45° with respect to the first direction D1. The third polarization gratings 200c may be provided in the third unit pixel P3, and the third polarization gratings 200c may be line patterns extending parallel to the second direction D2. The fourth polarization gratings 200d may be provided in the fourth unit pixel P4, and the fourth polarization gratings 200d may be line patterns extending in a direction at an angle of 135° with respect to the first direction D1. The polarization gratings 200a-200d in the first to fourth unit pixels P1-P4 may be substantially the same in terms of size and pitch.

Figure 8A:
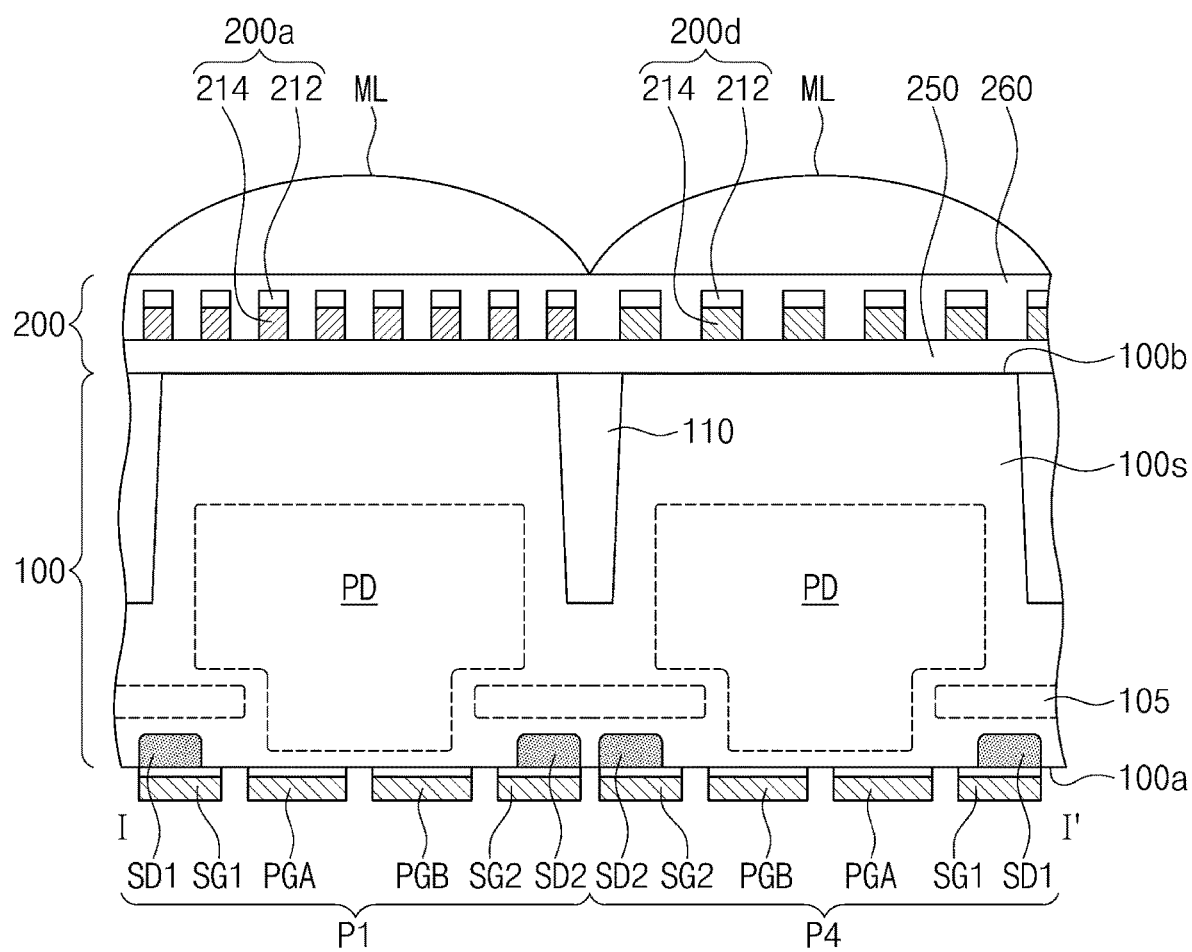
FIGS. 8A, 8B, and 8C are sectional views, which are taken along line I-I' of FIGS. 5 and 7 to illustrate an image sensor according to an embodiment of the inventive concept.
Figure 8B:
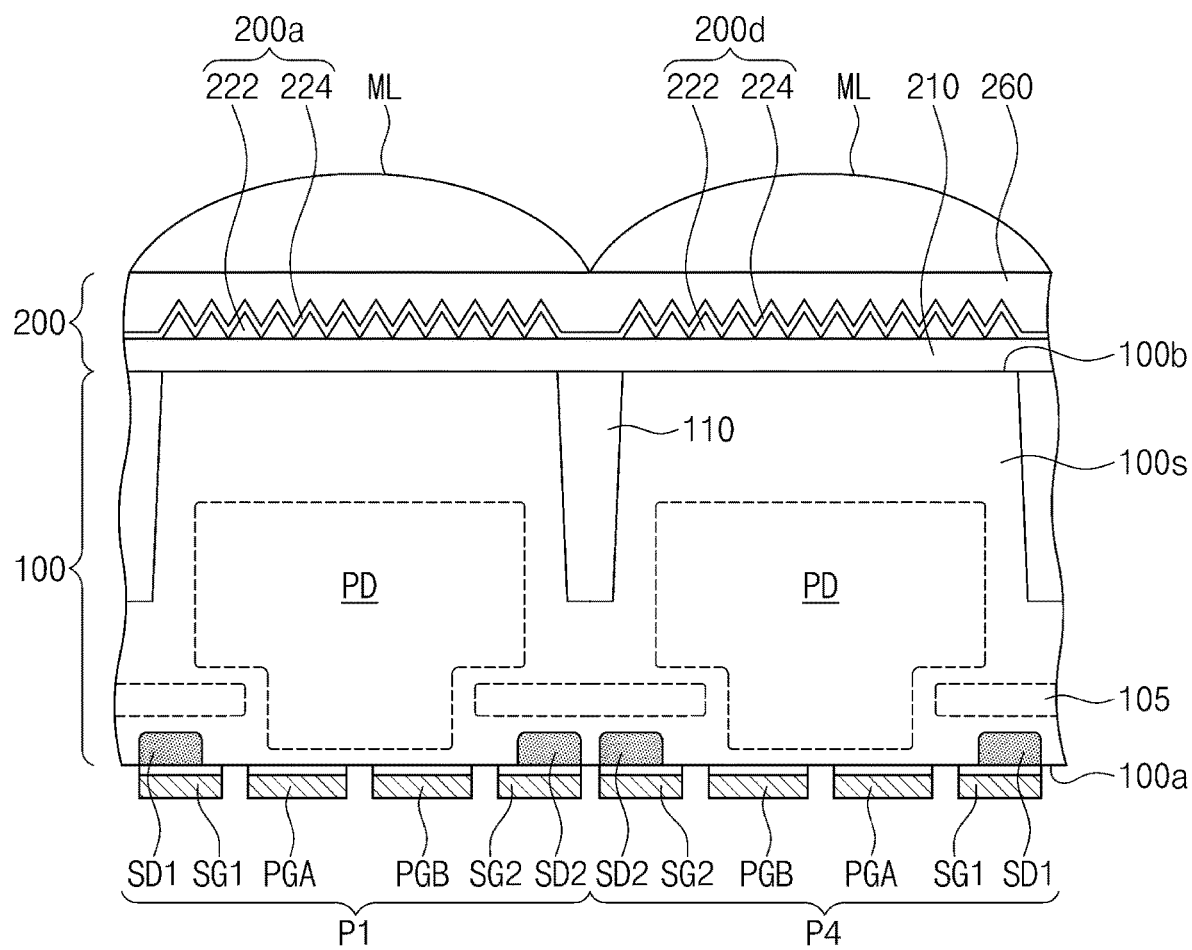
Figure 8C:
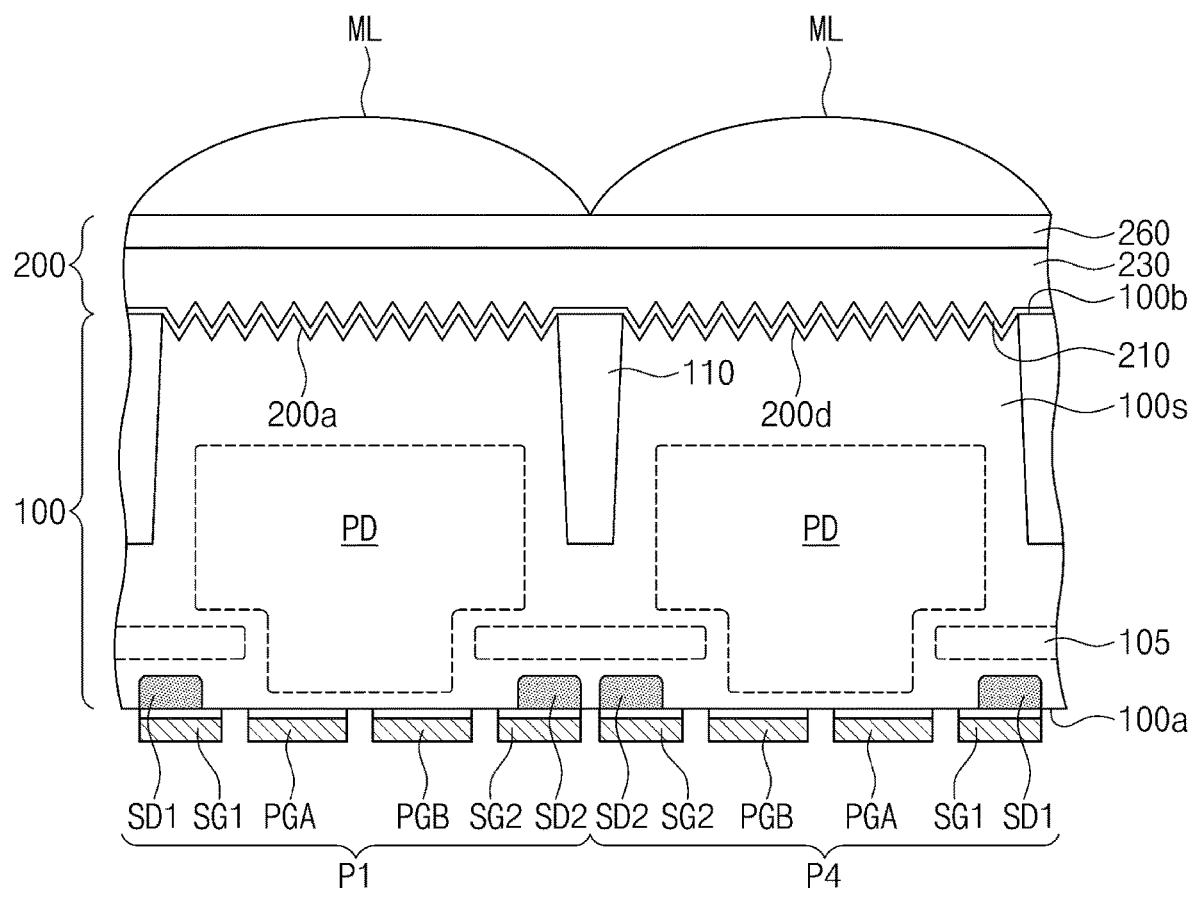

FIGS. 8A, 8B, and 8C are sectional views, which are taken along line I-I' of FIGS. 5 and 7 to illustrate an image sensor according to an embodiment of the inventive concept.

Referring to FIGS. 5, 7, 8A, 8B, and 8C, an image sensor according to an embodiment of the inventive concept may include the depth pixel array 100, the polarizer array 200, and a micro lens array. The polarizer array 200 may be disposed between a micro lens array including micro lenses ML and the depth pixel array 100, when viewed in a sectional view.

The depth pixel array 100 may include a semiconductor substrate 100s, a pixel isolation structure 110, which is provided to define the unit pixels P1-P4 in the semiconductor substrate 100s, and photoelectric conversion regions PD, which are provided in the unit pixels P1-P4, respectively.

In detail, the semiconductor substrate 100s may have a first or front surface 100a and a second or rear surface 100b that are opposite to each other. In an embodiment, a substrate, in which an epitaxial layer of a first conductivity type (e.g., p-type) is formed on a bulk silicon substrate of the first conductivity type, may be provided for the semiconductor substrate 100s, and during a process of fabricating an image sensor, the bulk silicon substrate may be removed so only the p-type epitaxial layer remains. In certain embodiments, the semiconductor substrate 100s may be a bulk semiconductor wafer, in which a well of the first conductivity type is formed.

The semiconductor substrate 100s may include the first to fourth unit pixels P1-P4 defined by the pixel isolation structure 110. The first to fourth unit pixels P1-P4 may be arranged in a matrix shape (e.g., in the first and second directions D1 and D2 as described above).

The pixel isolation structure 110 may be provided to enclose each of the first to fourth unit pixels P1-P4, when viewed in a plan view. In detail, the pixel isolation structure 110 may include first portions, which extend parallel to the first direction D1, and second portions, which extend parallel to the second direction D2 to cross the first portions.

When viewed in a plan view, the pixel isolation structure 110 may enclose each of the photoelectric conversion regions PD.

The pixel isolation structure 110 may be formed of an insulating material, whose refractive index is lower than that of the semiconductor substrate 100s (e.g., silicon), and may include one or more insulating layers. For example, the pixel isolation structure 110 may be formed of a silicon oxide layer, a silicon nitride layer, an undoped poly-silicon layer, a gaseous material, or any combination thereof. The formation of the pixel isolation structure 110 may include patterning the first surface 100a and/or the second surface 100b of the semiconductor substrate 100s to form a deep trench and filling the deep trench with an insulating material.

The photoelectric conversion regions PD may be provided in the first to fourth unit pixels P1-P4, respectively, of the semiconductor substrate 100s. The photoelectric conversion regions PD may be two-dimensionally arranged in the first direction D1 and the second direction D2. In an embodiment, the photoelectric conversion regions PD may be formed by injecting impurities into the semiconductor substrate 100s and may have a second conductivity type different from the first conductivity type of the semiconductor substrate 100s. In this case, the semiconductor substrate 100s of the first conductivity type and the photoelectric conversion regions PD of the second conductivity type may form pn junctions serving as photodiodes. The photoelectric conversion regions PD may convert light, which passed through the polarizer array 200, into electrical signals.

In each of the first to fourth unit pixels P1-P4, the first to fourth readout circuits RO1-RO4 described with reference to FIG. 4 may be provided on the first surface 100a of the semiconductor substrate 100s.

In detail, the first to fourth photogate electrodes PGA-PGD may overlap a center portion of each of the first to fourth unit pixels P1-P4, when viewed in a plan view. A gate insulating layer may be interposed between the first to fourth photogate electrodes PGA-PGD and the semiconductor substrate 100s.

As an example, in the unit pixels P1-P4, the storage gate electrodes SG1-SG4 may be disposed adjacent to the first to fourth photogate electrodes PGA-PGD. In addition, storage diode regions SD1 and SD2 may be provided between the storage gate electrodes SG1-SG4 and the first to fourth photogate electrodes PGA-PGD and in the semiconductor substrate 100s. The storage diode regions SD1 and SD2 may be formed by injecting impurities into the semiconductor substrate 100s and may have a conductivity type different from the semiconductor substrate 100s. The storage diode regions SD1 and SD2 may partially overlap the storage gate electrodes SG1-SG4 in a plan view. Electric charges produced in the photoelectric conversion region PD may be stored in the storage diode regions SD1 and SD2.

Furthermore, although not shown in FIGS. 8A to 8C, the floating diffusion node FD1-FD4 may be formed by injecting impurities into the semiconductor substrate 100s and may have a conductivity type different from the semiconductor substrate 100s. For example, the floating diffusion node FD1-FD4 may be an n-type impurity region that is doped in the semiconductor substrate 100s.

In addition, a barrier impurity region 105 may be provided in the semiconductor substrate 100s. The barrier impurity region 105 may be provided between the photoelectric conversion region PD and the storage diode regions SD1 and SD2 and floating diffusion node FD1-FD4, when viewed in a sectional view. The barrier impurity region 105 may be formed by injecting impurities into the semiconductor substrate 100s and may have the same conductivity type as the semiconductor substrate 100s.

In an embodiment, a fixed charge layer 250 may be provided on the second surface 100b of the semiconductor substrate 100s, and the polarization gratings 200a-200d may be provided on the fixed charge layer 250.

The fixed charge layer 250 covers the second surface 100b of the semiconductor substrate 100s. The fixed charge layer 250 may be formed on the second surface 100b of the semiconductor substrate 100s. In some embodiments, the fixed charge layer 250 may be formed to contact the second surface 100b of the semiconductor substrate 100s. As used herein, the term "contact" refers to a direct connection (i.e., touching). The fixed charge layer 250 may include negative charges, and the negative charges may be coupled with holes, which may be produced by surface defects on the second surface 100b of the semiconductor substrate 100s. Thus, it may be possible to suppress a dark current, which may be produced from the second surface 100b of the semiconductor substrate 100s. The fixed charge layer 250 may be formed of or include at least one of, for example, $Al_2O_3$, $CeF_3$, $HfO_2$, ITO, MgO, $Ta_2O_5$, $TiO_2$, $ZrO_2$, Si, Ge, ZnSe, ZnS, or $PbF_2$.

In each unit pixel P1-P4, the polarization gratings 200a-200d may be parallel to each other and may have a line shape. The polarization gratings 200a-200d may cross each photoelectric conversion region PD, when viewed in a plan view.

In detail, as shown in FIGS. 7 and 8A, the first polarization gratings 200a in the first unit pixel P1 may be line-shaped patterns parallel to the first direction D1. The second polarization gratings 200b in the second unit pixel P2 may be line-shaped patterns that are at an angle 45° to the first polarization gratings 200a. The third polarization gratings 200c in the third unit pixel P3 may be line-shaped patterns that are at an angle 90° to the first polarization gratings 200a. The fourth polarization gratings 200d in the fourth unit pixel P4 may be line-shaped patterns that are at an angle 135° to the first polarization gratings 200a. As discussed herein, and for ease of description, a group of polarization grating lines that extend in the same direction (e.g., the group of gratings in any one of the unit pixels P1-P4) may be referred to as a grating block. An individual line in a grating block may be referred to as a grating line.

In each of the first to fourth pixel regions P1-P4, the first to fourth polarization gratings 200a-200d may be arranged to have a uniform width and a uniform height and may be spaced apart from each other by a specific distance. For example, each polarization grating block may be arranged to have polarization grating lines, each line having the same width and height as the other lines of the block, wherein the grating lines in the grating block are equally spaced apart from each other. Furthermore, each polarization grating block may have the same size and shape from a plan view as the other polarization grating blocks, and the polarization grating lines in all of the polarization grating blocks may have the same height and the same width in a direction perpendicular to the direction in which they extend, and may be spaced apart by the same distance as each other.

Each of the first to fourth polarization gratings 200a-200d may include a conductive pattern 212 and a dielectric pattern 214, which are sequentially stacked. Here, the conductive pattern 212 may be formed of or include a metal material, such as tungsten, aluminum, titanium, tantalum, and copper. The dielectric pattern 214 may be formed of or include an insulating material, such as SiN, SiON, SiC, SICN, or SiCO.

The formation of the first to fourth polarization gratings 200a-200d may include sequentially depositing a conductive layer and a dielectric layer on the fixed charge layer 250 and then pattering the dielectric layer and the conductive layer.

An insulating planarization layer 260 may be disposed on the fixed charge layer 250 provided with the first to fourth polarization gratings 200a-200d. The insulating planarization layer 260 may be provided to fill gaps between the first to fourth polarization gratings 200a-200d. The insulating planarization layer 260 may be formed of or include at least one of, for example, $Al_2O_3$, $CeF_3$, $HfO_2$, ITO, MgO, $Ta_2O_5$, $TiO_2$, $ZrO_2$, Si, Ge, ZnSe, ZnS, or $PbF_2$. In an embodiment, the insulating planarization layer 260 may be formed of or include at least one of organic materials having high refractive indices (e.g., siloxane resin, benzocyclobutene (BCB), polyimide, acryl, parylene C, poly(methyl methacrylate) (PMMA), polyethylene terephthalate (PET), or the like). In certain embodiments, the insulating planarization layer 260 may be formed of or include at least one of, for example, strontium titanate ($SrTiO_3$), polycarbonate, glass, bromine, sapphire, cubic zirconia, potassium niobate ($KNbO_3$), moissanite (SiC), gallium(III) phosphide (GaP), gallium(III) arsenide (GaAs), or the like.

Referring to FIG. 8B, each of the first to fourth polarization gratings 200a-200d may include a first dielectric pattern 222 provided on the fixed charge layer 210 and a second dielectric layer 224 covering the first dielectric patterns 222. Here, the first dielectric patterns 222 may be formed of or include a dielectric material whose refractive index is different from the second dielectric layer 224. In addition, each of the first dielectric patterns 222 may have inclined sidewalls that are opposite to each other. For example, the first dielectric patterns 222 may include wedge-shaped pieces or sections. The second dielectric layer 224 may be provided to conformally cover exposed surfaces of the first dielectric patterns 222.

Referring to FIG. 8C, the first to fourth polarization gratings 200a-200d may be provided on and may be formed from the second surface 100b of the semiconductor substrate 100s.

The first to fourth polarization gratings 200a-200d may be recess regions, which are formed by forming an etch mask pattern on the second surface 100b of the semiconductor substrate 100s and then anisotropically etching the second surface 100b of the semiconductor substrate 100s using the etch mask pattern. The first to fourth polarization gratings 200a-200d may be portions of the semiconductor substrate 100s. The recess regions formed in the semiconductor substrate 100s may be defined by inclined surfaces that are opposite to each other. In other words, the first to fourth polarization gratings 200a-200d may have a wedge shape.

A fixed charge layer 210 may be provided to conformally cover the first to fourth polarization gratings 200a-200d provided on the second surface 100b of the semiconductor substrate 100s. The fixed charge layer 210 contact the first to fourth polarization gratings 200a-200d.

An anti-reflection layer 230 may be disposed on the second surface 100b of the semiconductor substrate 100s provided with the first to fourth polarization gratings 200a-200d. The anti-reflection layer 230 may be disposed between the fixed charge layer 210 and the insulating planarization layer 260. The anti-reflection layer 230 may be formed of or include at least one of, for example, SiON, SiC, SICN, or SiCO.

Referring to FIGS. 8A to 8C, the micro lenses ML may be disposed on the insulating planarization layer 260 to correspond to the photoelectric conversion regions PD, respectively. The micro lenses ML may be two-dimensionally arranged in two different directions (e.g., the first and second directions D1 and D2). The micro lenses ML may have an upward convex shape and may have a specific curvature radius. The micro lenses ML may change a path of light to be incident into the image sensor to condense the incident light. The micro lenses ML may be formed of or include an optically transparent resin.

Figure 9:
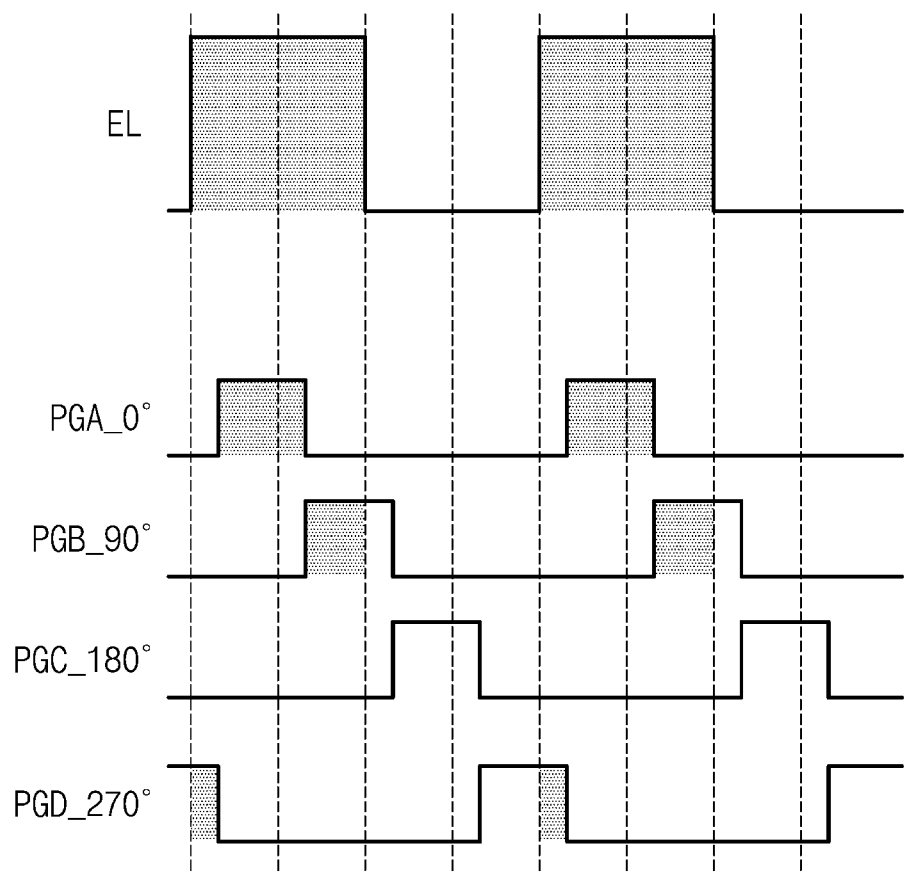
FIG. 9 is a timing diagram illustrating an example operation of the depth pixel in the image sensor of FIG. 4.

FIG. 9 is a timing diagram illustrating an operation of the depth pixel in the image sensor of FIG. 4.

Referring to FIGS. 4, 5, 6, 7, and 9, a pulsed optical signal EL may be emitted from the light source 1 to the object O, as shown in FIG. 1. A fraction of the optical signal EL may be reflected by the object O to form a reflected light RL that is incident onto the unit pixels P1-P4, and here, the reflected light RL may be delayed, compared with the optical signal EL. Although each pulse of the optical signal EL is shown in FIG. 9 to have a rectangular waveform, the optical signal EL may be provided in the form of a sinusoidal wave.

In each unit pixel P1-P4, a first photo control signal PGA_0, which is synchronized with the optical signal EL (e.g., see FIG. 1) provided to the object O (e.g., see FIG. 1), may be applied to the first photogate electrode PGA, and a third photo control signal PGC_180, which has a phase difference of 180° with respect to the first photo control signal PGA_0, may be applied to the third photogate electrode PGC. A second photo control signal PGB_90, which has a phase difference of 90° with respect to the first photo control signal PGA_0, may be applied to the second photogate electrode PGB, and a fourth photo control signal PGD_270, which has a phase difference of 180° with respect to the second photo control signal PGB_90, may be applied to the fourth photogate electrode PGD.

In the case where the depth pixel has the 4-tap structure, the first to fourth photogate signals PGA_0, PGB_90, PGC_180, and PGD_270 may be sequentially applied to the first to fourth photogate electrodes PGA-PGD with a specific time gap, during a one-time sampling period.

The first to fourth photogate signals PGA_0-PGD_270 applied to the first to fourth photogate electrodes PGA-PGD may lead to a change in electric potential of the photoelectric conversion region PD.

An amount of electric charges detected from the first to fourth floating diffusion nodes FD1-FD4 may vary depending on how long the reflected optical signal RL is overlapped with the first to fourth photo control signals PGA-PGD. Also, signals, which are output from the first to fourth readout circuits RO1-RO4 in each unit pixel P1-P4, may contain depth information obtained from the polarized lights.

In detail, light, which passes through the first polarization gratings 200a in the first unit pixel P1 and has a first polarization component, may be output as electrical signals different from each other through a first set of first to fourth readout circuits RO1-RO4. Light, which passes through the second polarization gratings 200b in the second unit pixel P2 and has a second polarization component, may be output as electrical signals different from each other through a second set of first to fourth readout circuits RO1-RO4. Light, which passes through the third polarization gratings 200c in the third unit pixel P3 and has a third polarization component, may be output as electrical signals different from each other through a third set of the first to fourth readout circuits RO1-RO4. Light, which passes through the fourth polarization gratings 200d in the fourth unit pixel P4 and has a fourth polarization component, may be output as electrical signals different from each other through a fourth set of first to fourth readout circuits RO1-RO4.

Figure 10A:
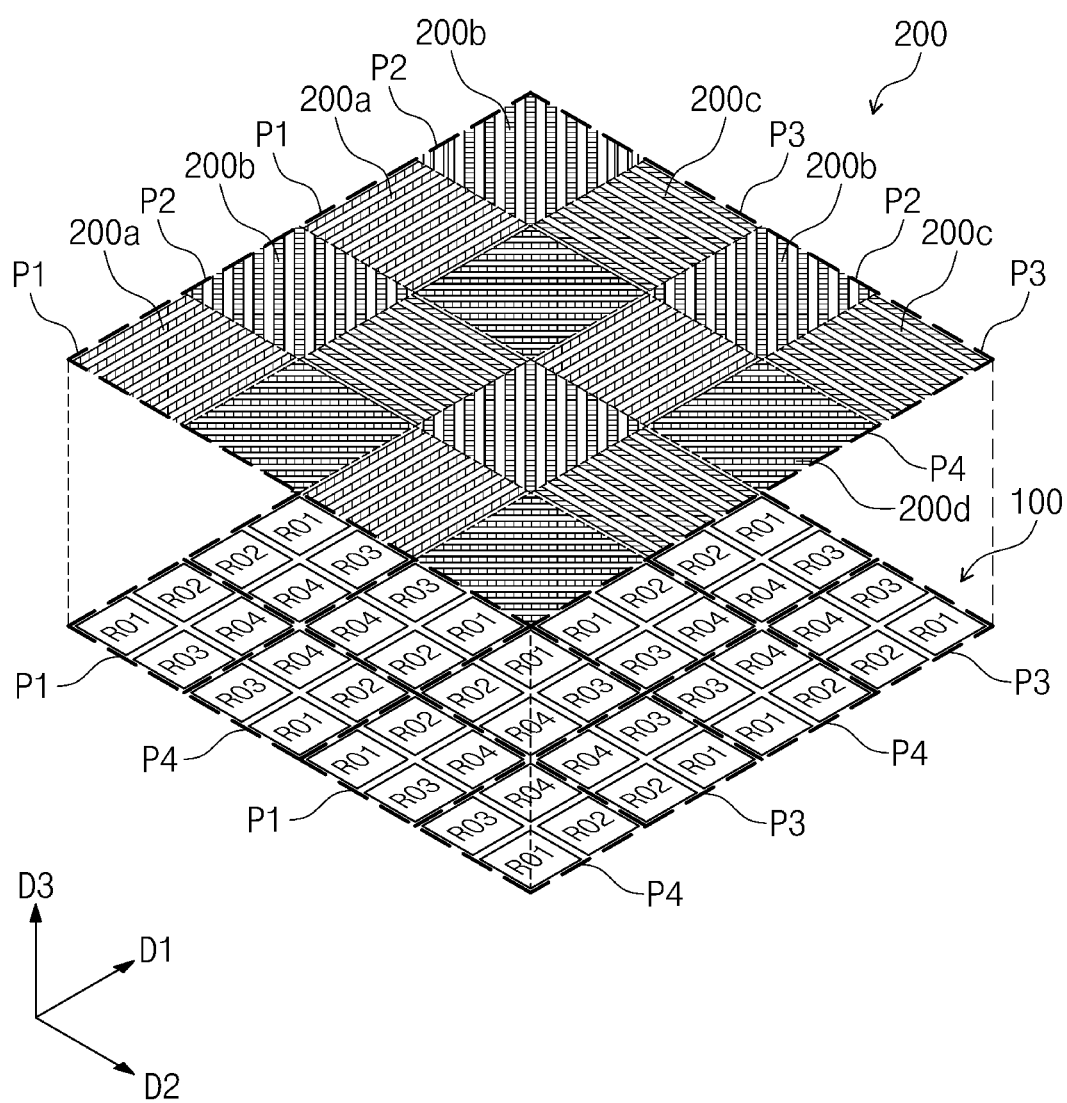
FIG. 10A is a diagram schematically illustrating an active pixel sensor array of an image sensor according to an embodiment of the inventive concept.
Figure 10B:
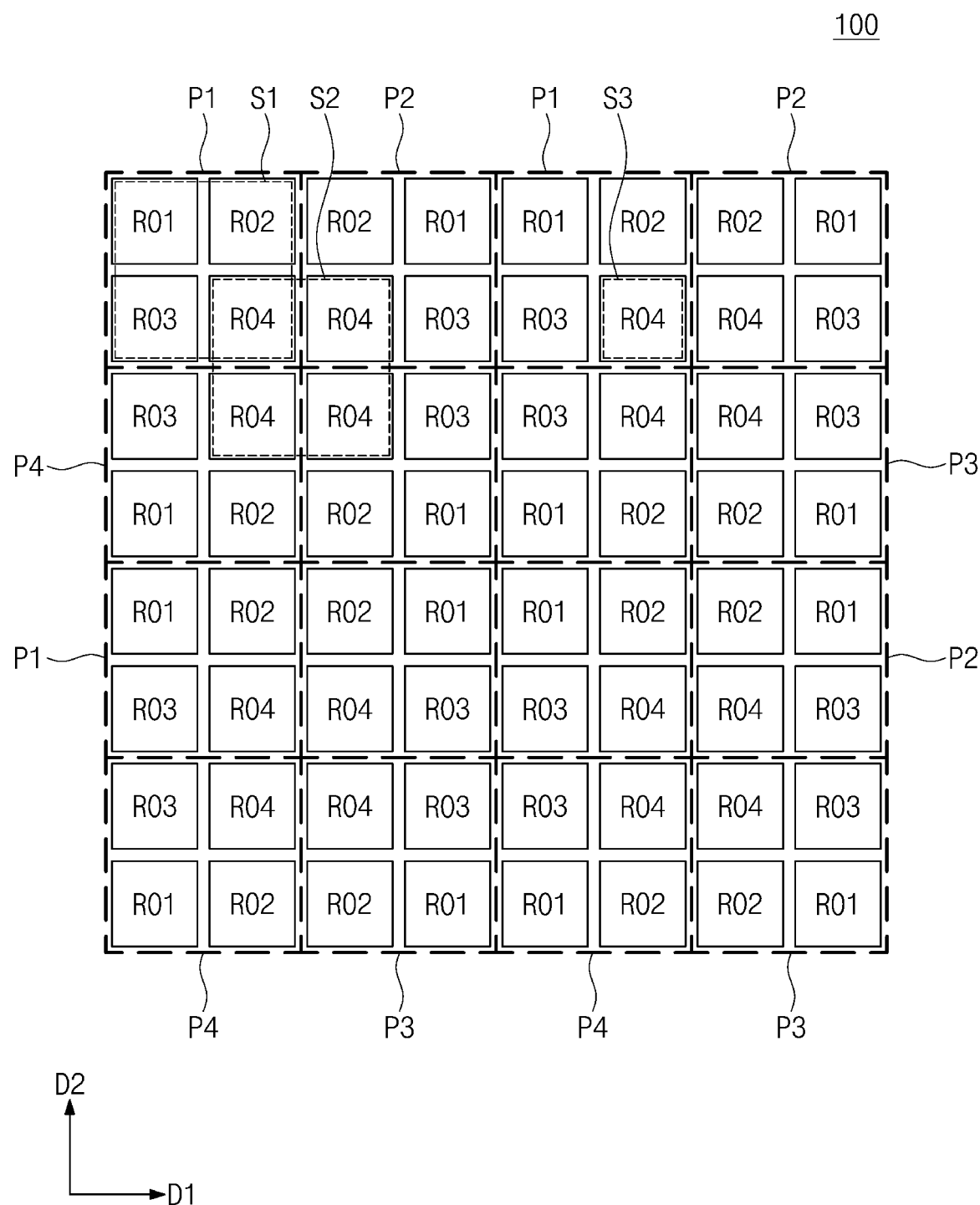
FIG. 10B is an example plan view illustrating a depth pixel array of the image sensor shown in FIG. 10A.

FIG. 10A is a diagram schematically illustrating an active pixel sensor array of an image sensor according to an embodiment of the inventive concept. FIG. 10B is a plan view illustrating a depth pixel array of the image sensor shown in FIG. 10A.

Referring to FIG. 10A, each grouping of first to fourth unit pixels P1-P4 may constitute a single optical sensor block, and a plurality of optical sensor blocks may be two-dimensionally arranged in the first direction D1 and the second direction D2.

Each of the first to fourth unit pixels P1-P4 may include one of the polarization gratings 200a-200d and a depth pixel including the first to fourth readout circuits RO1-RO4, as described above. The polarization gratings 200a-200d of the first to fourth unit pixels P1-P4 may have polarization directions different from each other, as previously described with reference to FIG. 7.

The first unit pixel P1 may include the first polarization gratings 200a and the first to fourth readout circuits RO1-RO4 corresponding to the same. The second unit pixel P2 may include the second polarization gratings 200b and the first to fourth readout circuits RO1-RO4 corresponding to the same. The third unit pixel P3 may include the third polarization gratings 200c and the first to fourth readout circuits RO1-RO4 corresponding to the same. The fourth unit pixel P4 may include the fourth polarization gratings 200d and the first to fourth readout circuits RO1-RO4 corresponding to the same.

In the depth pixel array 100, the first and second unit pixels Pb and P2, which are adjacent to each other in the first direction D1, may be disposed in a mirror-symmetric manner with respect to a line parallel to the second direction D2. Furthermore, the first and second unit pixels P1 and P2 and the third and fourth unit pixels P3 and P4 may be disposed in a mirror-symmetric manner with respect to a line parallel to the first direction D1. Thus, the fourth readout circuits RO4 of the first to fourth unit pixels P1-P4 may be disposed to be adjacent to each other in the first and second directions D1 and D2. In addition, the first to third readout circuits RO1-RO3 may be arranged in the same manner.

In the embodiments shown in FIGS. 10A and 10B, by performing a one-time operation of sensing a single optical sensor block composed of the first to fourth unit pixels P1-P4, it is possible to obtain information on polarization states of four directions and depth information produced by photogate signals of four different phases.

Furthermore, the polarization information or the depth information may be selectively obtained, depending on how to select a region 51, S2, or S3 for summation of signals to be output from the first to fourth readout circuits RO1-RO4 of the first to fourth unit pixels P1-P4.

As an example, by summing the first to fourth output signals output from the first to fourth readout circuits RO1-RO4 of the first unit pixel P1, it is possible to obtain depth information regarding the first polarized light PL1 (e.g., see FIG. 3) with the first polarization state. By summing the first to fourth output signals output from the first to fourth readout circuits RO1-RO4 of the second unit pixel P2, it is possible to obtain depth information regarding the second polarized light PL2 (e.g., see FIG. 3) with the second polarization state. By summing the first to fourth output signals output from the first to fourth readout circuits RO1-RO4 of the third unit pixel P3, it is possible to obtain depth information regarding the third polarized light PL3 (e.g., see FIG. 3) with the third polarization state. By summing the first to fourth output signals output from the first to fourth readout circuits RO1-RO4 of the fourth unit pixel P4, it is possible to obtain depth information regarding the fourth polarized light PL4 (e.g., see FIG. 3) with the fourth polarization state.

In an embodiment, by summing the fourth output signals output from the fourth readout circuits (i.e., the region S2) of the first to fourth unit pixels P1-P4 (i.e., from four fourth readout circuits), it is possible to obtain depth information. For example, the depth information may contain an average of the polarized lights PL1, PL2, PL3, and PL4 (e.g., see FIG. 3), which pass through the first to fourth polarization gratings and have the first to fourth polarization components.

In an embodiment, by summing the first to fourth output signals respectively output from the first to fourth readout circuits RO1-RO4 (i.e., a region S3) by photogate signals with four different phases, it is possible to obtain depth information.

Figure 11:
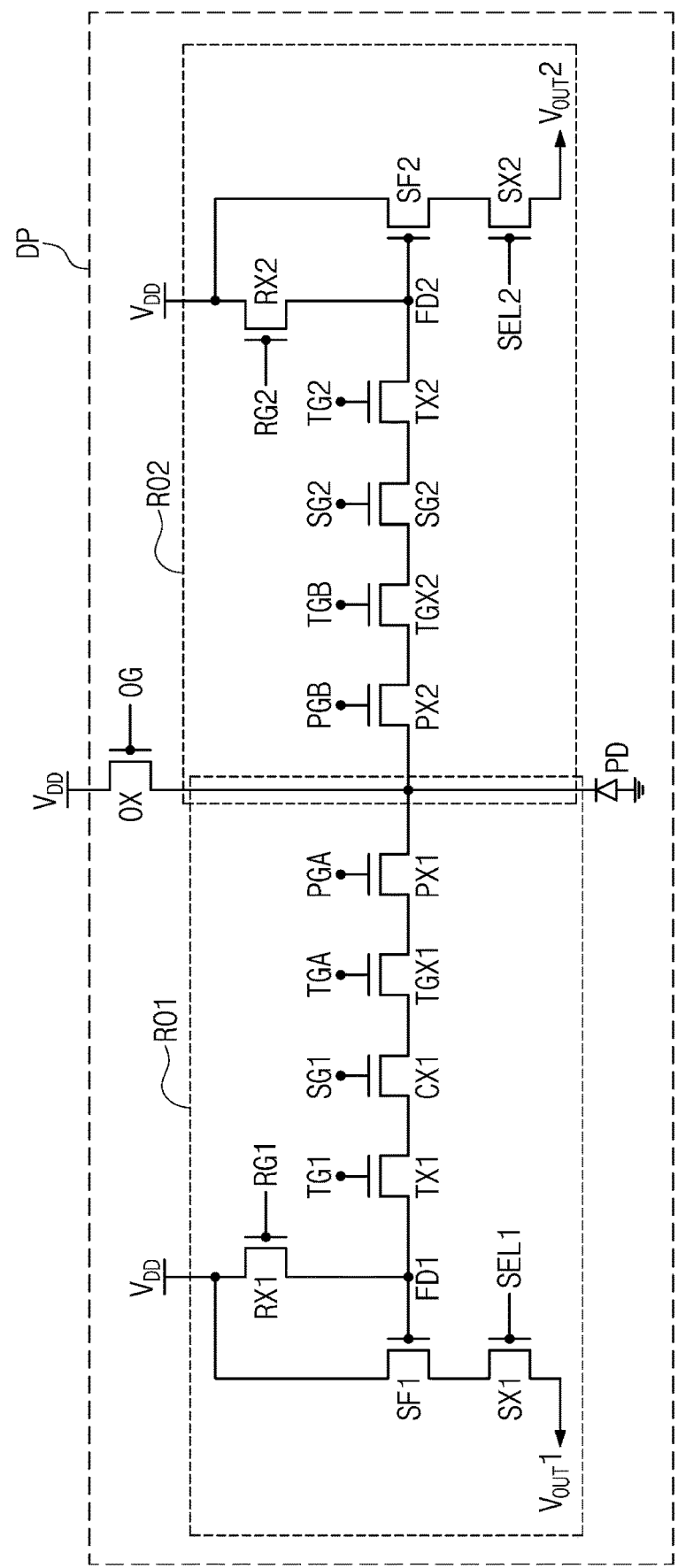
FIG. 11 is a circuit diagram illustrating a depth pixel of a 2-tap structure, which is provided in a depth pixel array of an image sensor according to an embodiment of the inventive concept.

FIG. 11 is a circuit diagram illustrating a depth pixel of a 2-tap structure, which is provided in a depth pixel array of an image sensor according to an embodiment of the inventive concept. A 2-tap structure differs from a 4-tap structure in that the 2-tap structure only has two readout circuits per unit pixel, while the 4-tap structure has four readout circuits per unit pixel.

Referring to FIG. 11, the depth pixel of the 2-tap structure may include the photoelectric conversion device PD, the first and second readout circuits RO1 and RO2, and the overflow transistor OX.

The first and second readout circuits RO1 and RO2 may be configured to have substantially the same structure as the first and second readout circuits RO1 and RO2 previously described with reference to FIG. 4. In addition, the first and second readout circuits RO1 and RO2 may share one photoelectric conversion device PD and one overflow transistor OX.

Figure 12A:
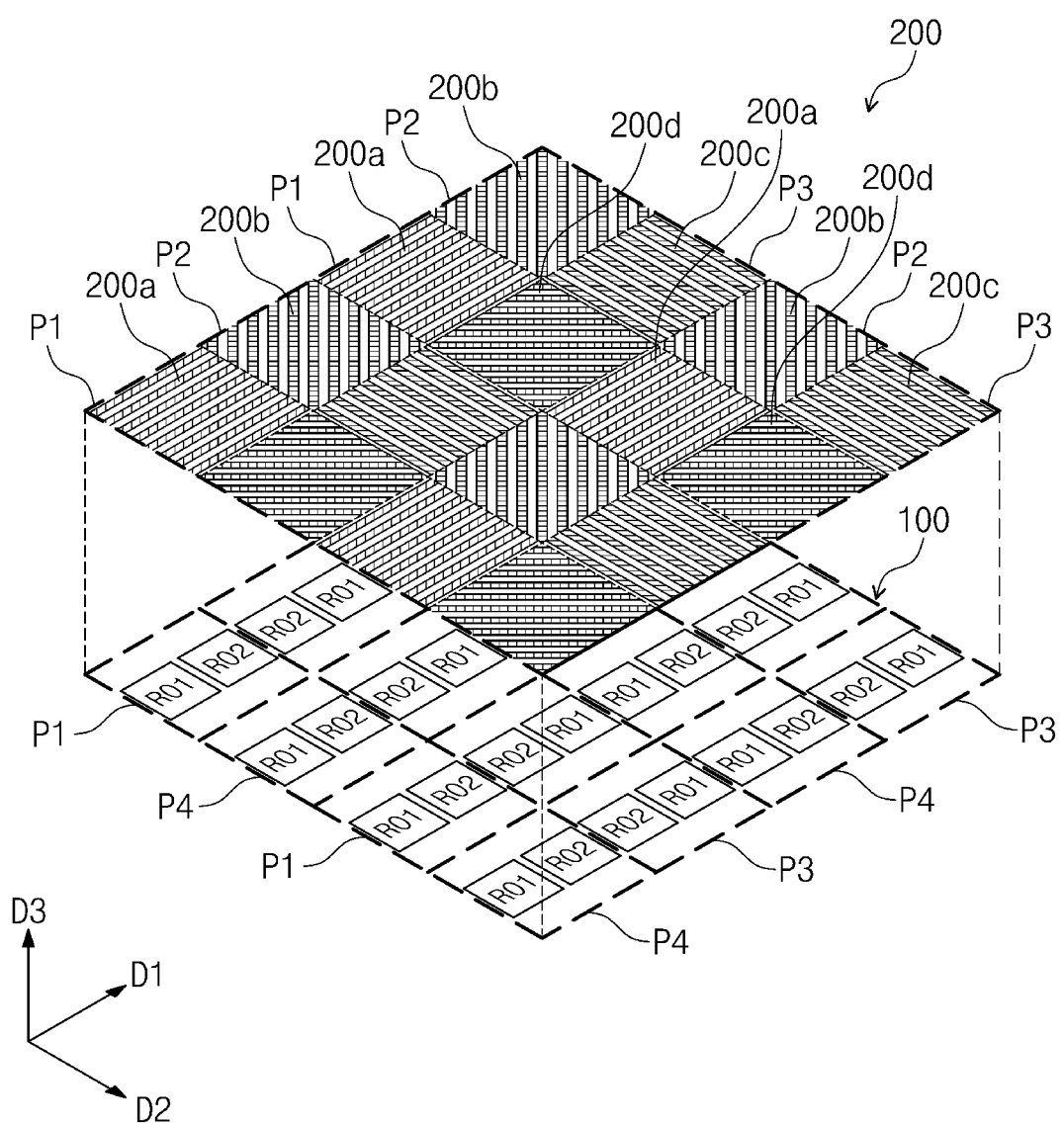
FIGS. 12A, 13A, and 14A are diagrams, each of which schematically illustrates an active pixel sensor array of an image sensor according to an embodiment of the inventive concept.
Figure 12B:
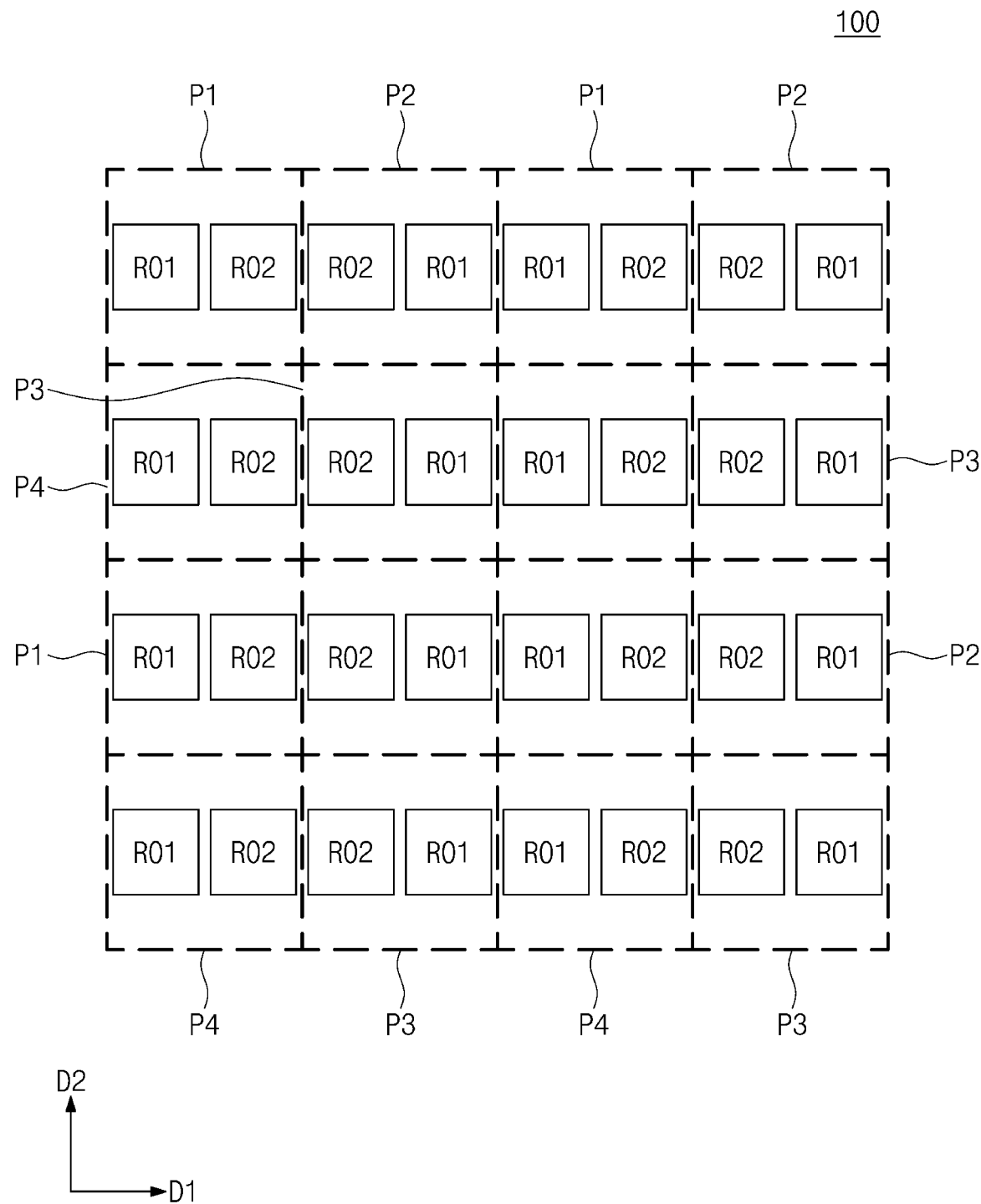
FIGS. 12B, 13B, 14B, and 14C are plan views, each of which illustrates a depth pixel array of a corresponding one of the image sensors shown in FIGS. 12A to 14A.
Figure 13A:
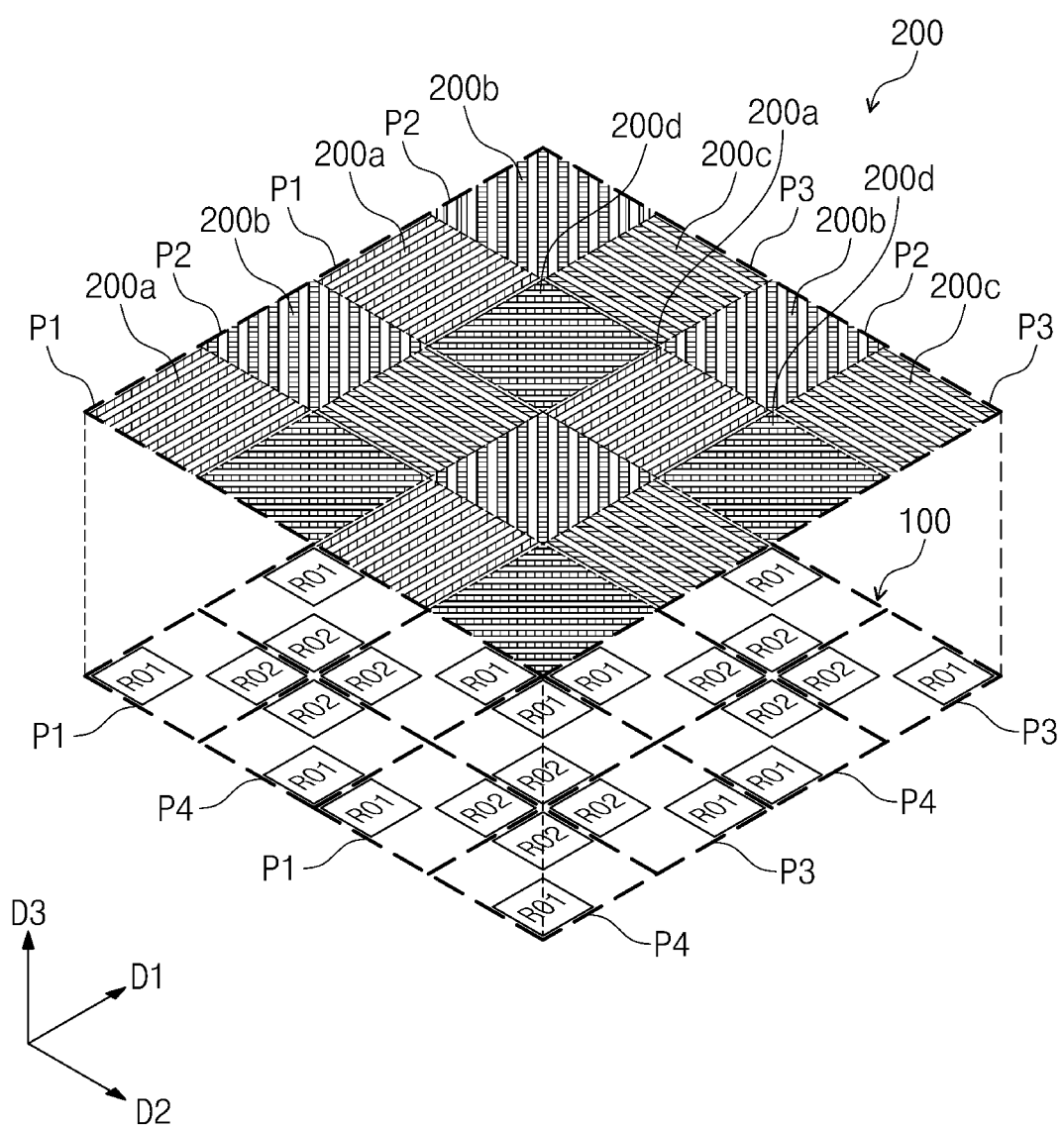
Figure 13B:
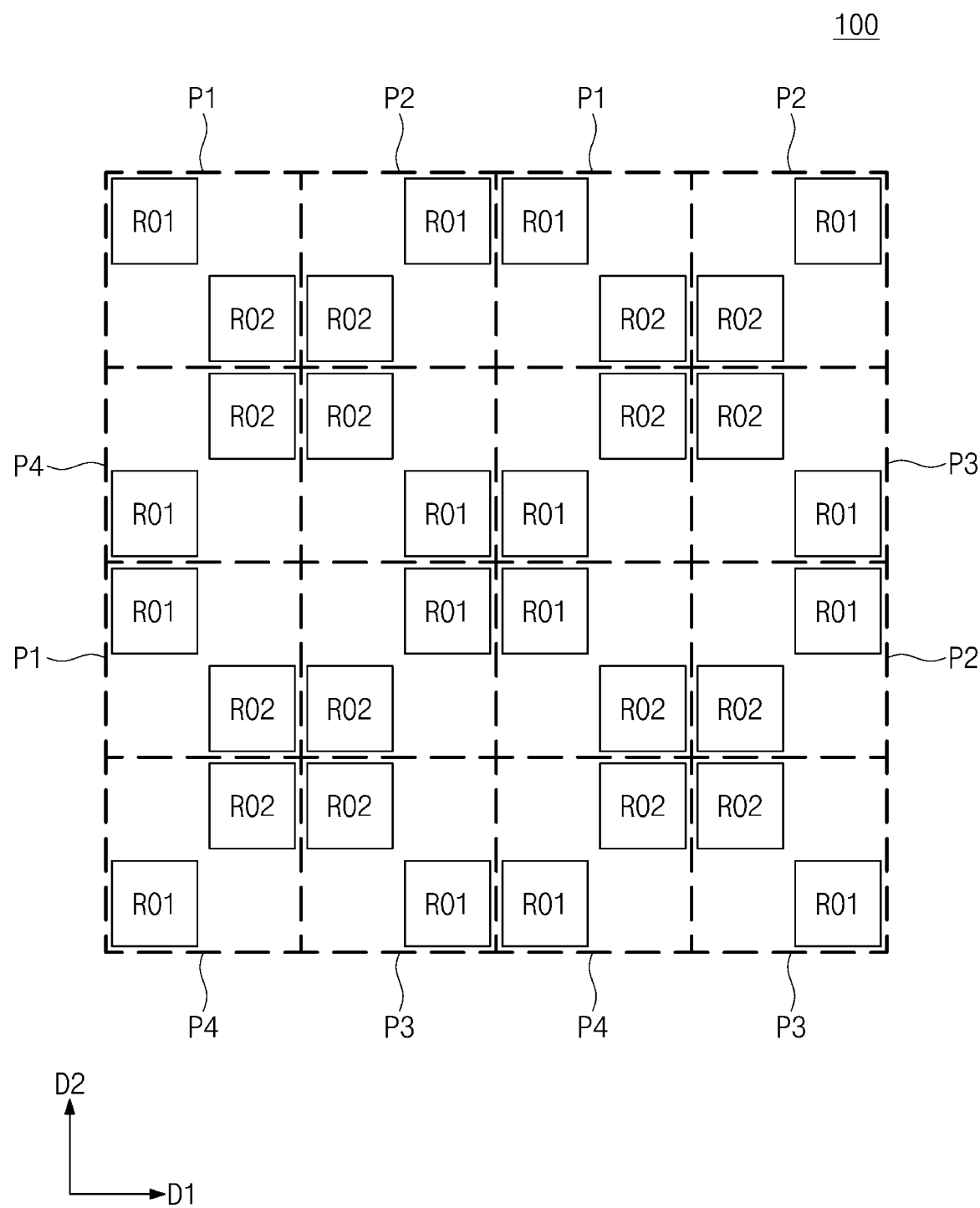
Figure 14A:
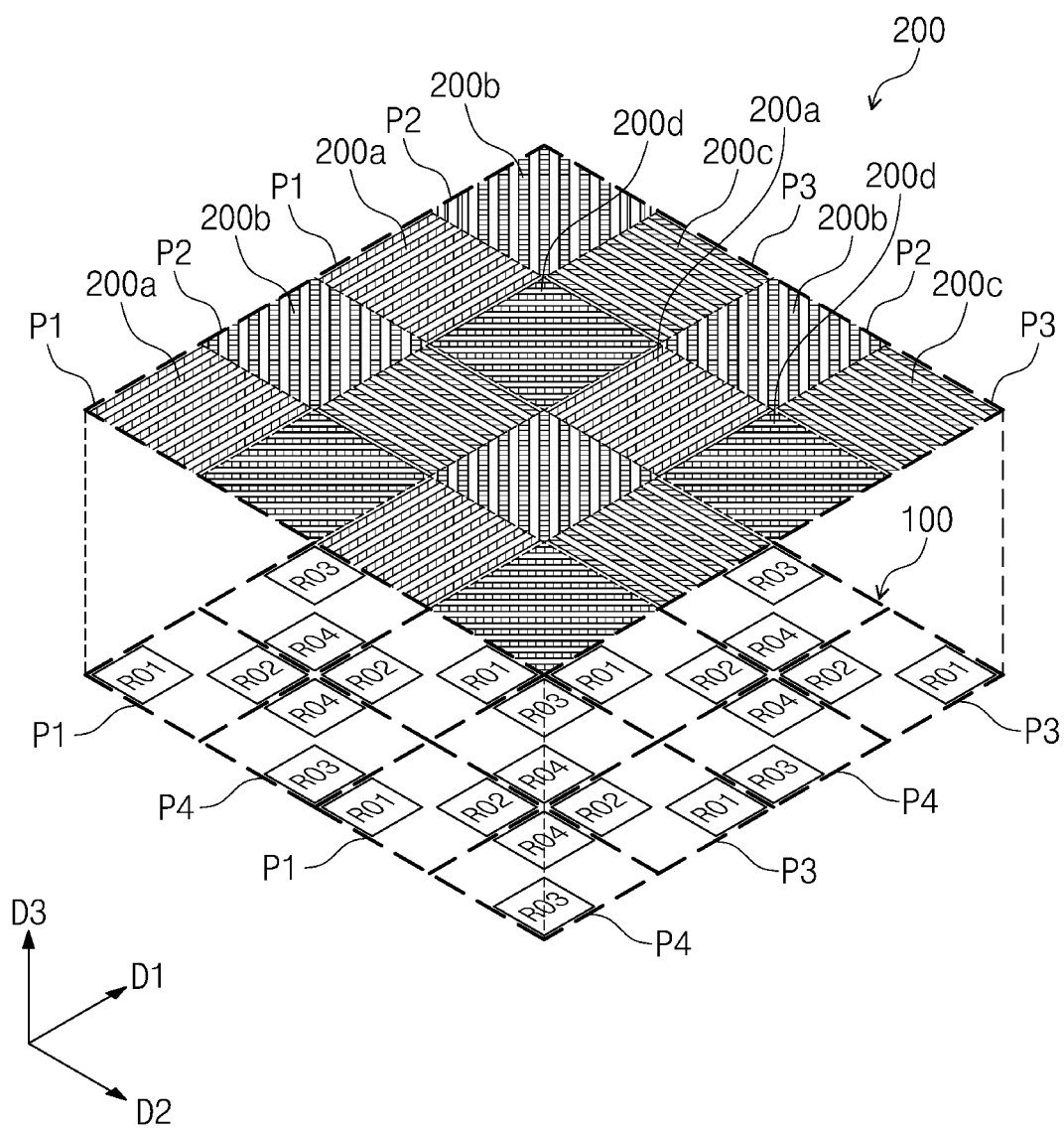

FIGS. 12A, 13A, and 14A are diagrams, each of which schematically illustrates an active pixel sensor array of an image sensor according to an embodiment of the inventive concept. FIGS. 12B, 13B, 14B, and 14C are plan views, each of which illustrates a depth pixel array of a corresponding one of the image sensors shown in FIGS. 12A to 14A.

Referring to FIGS. 12A to 14A, each of the first to fourth unit pixels P1-P4 in the depth pixel array 100 may include one photoelectric conversion device PD, the first and second readout circuits RO1 and RO2, and the overflow transistor OX, as described with reference to FIG. 11.

The polarizer array 200 may include the polarization gratings 200a-200d, which are disposed in the first to fourth unit pixels P1-P4, respectively, and are aligned in different directions, as described above.

The first unit pixel P1 may include the first polarization gratings 200a and the first and second readout circuits RO1 and RO2 corresponding to the same. The second unit pixel P2 may include the second polarization gratings 200b and the first and second readout circuits RO1 and RO2 corresponding to the same. The third unit pixel P3 may include the third polarization gratings 200c and the first and second readout circuits RO1 and RO2 corresponding to the same.

The fourth unit pixel P4 may include the fourth polarization gratings 200d and the first and second readout circuits RO1 and RO2 corresponding to the same.

As described above, the first to fourth unit pixels P1-P4 may constitute a single optical sensor block, and a plurality of optical sensor blocks may be two-dimensionally arranged in the first and second directions D1 and D2.

Referring to FIGS. 12A and 12B, in the depth pixel array 100, the first and second unit pixels P1 and P2, each of which includes the first and second readout circuits RO1 and RO2, may be alternately arranged in the first direction D1. In addition, the third and fourth unit pixels P3 and P4, each of which includes the first and second readout circuits RO1 and RO2, may be alternately arranged in the first direction D1. Here, the first readout circuits RO1 of the first second unit pixels P1 and P2 may be adjacent to each other, and the second readout circuits RO2 of the first and second unit pixels P1 and P2 may be adjacent to each other. Similarly, the first readout circuits RO1 of the third and fourth unit pixels P3 and P4 may be adjacent to each other, and the second readout circuits RO2 of the third and fourth unit pixels P3 and P4 may be adjacent to each other.

Referring to FIGS. 13A and 13B, in each of the first to fourth unit pixels P1-P4, the first and second readout circuits RO1 and RO2 may be arranged in a direction diagonal to the first and second directions D1 and D2.

The first and second unit pixels P1 and P2 adjacent to each other in the first direction D1 may be disposed in a mirror-symmetric manner, and the third and fourth unit pixels P3 and P4 adjacent to each other in the first direction D1 may be disposed in a mirror-symmetric manner. In addition, the first and fourth unit pixels P1 and P4 adjacent to each other in the second direction D2 may be disposed in a mirror-symmetric manner, and the second and third unit pixels P2 and P3 adjacent to each other in the second direction D2 may be disposed in a mirror-symmetric manner. The first to fourth unit pixels P1-P4 adjacent to each other may be disposed in a mirror-symmetric manner in the first direction D1 and the second direction D2.

Figure 14B:
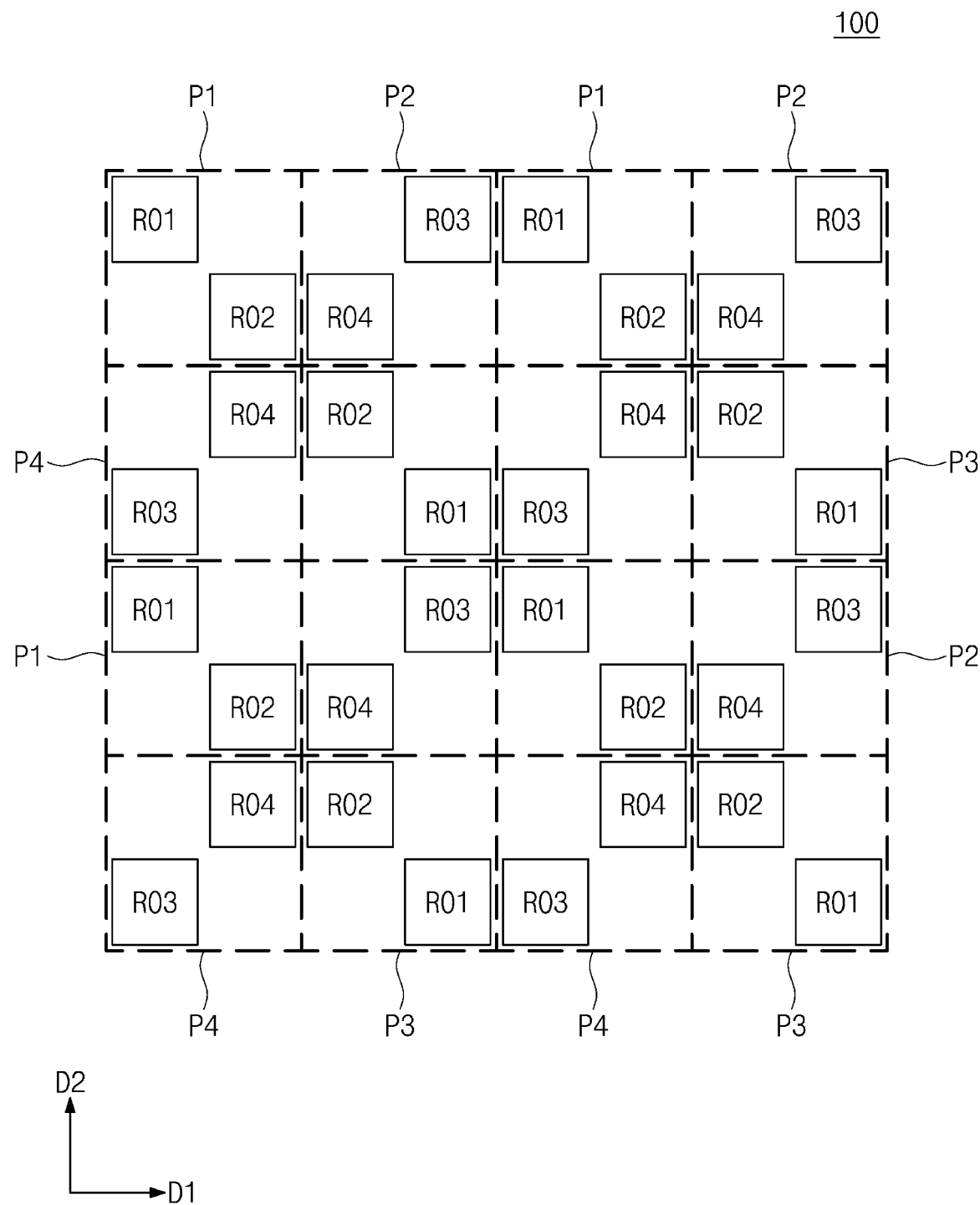
Figure 14C:
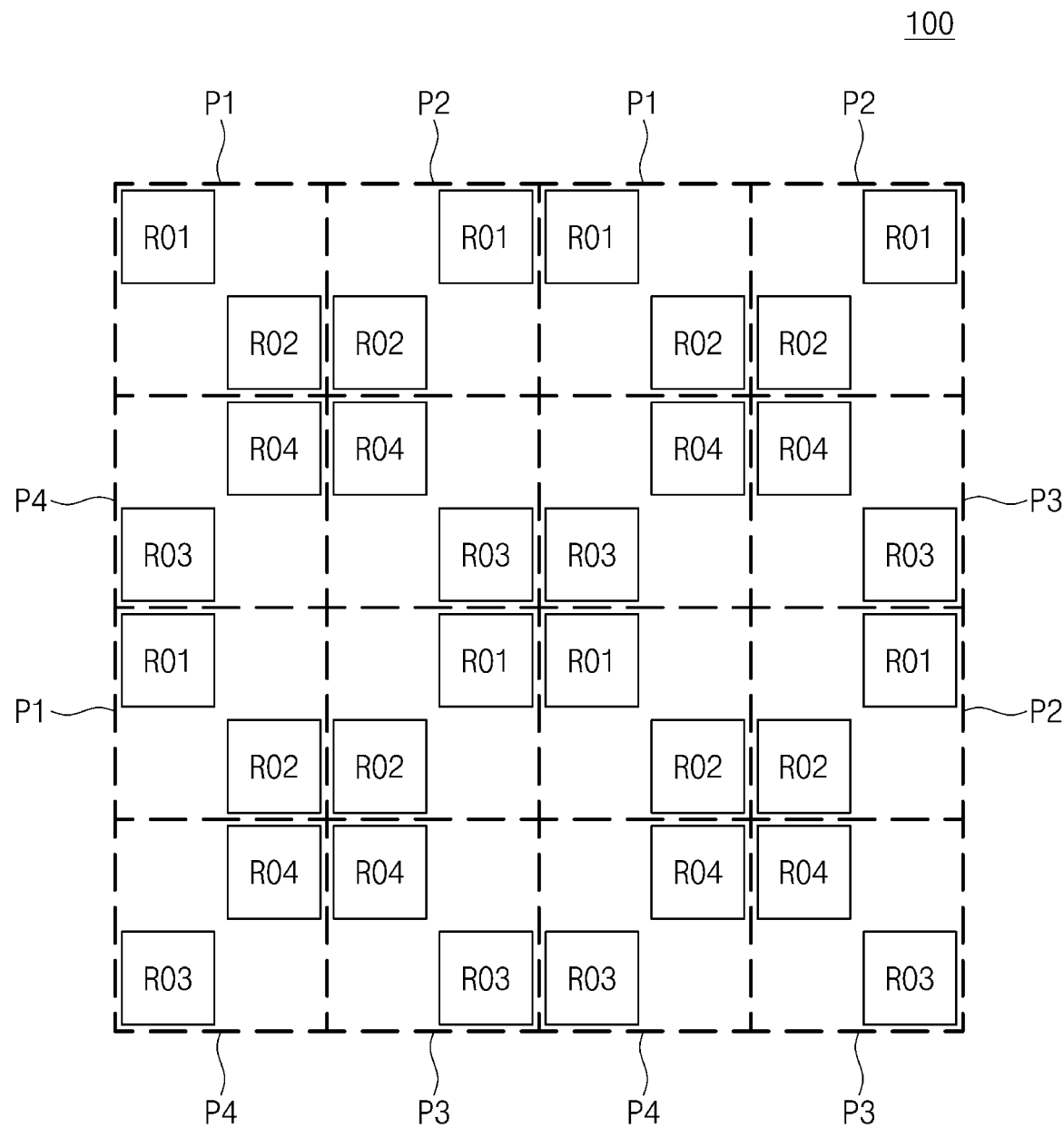

Referring to FIGS. 14A, 14B, and 14C, each of the first to fourth unit pixels P1-P4 may include a pair of readout circuits, and an adjacent pair of unit pixels may be configured to obtain the depth information from photogate signals with four different phases.

For example, as shown in FIGS. 14A and 14B, each of the first and third unit pixels P1 and P3 may include the first and second readout circuits RO1 and RO2, and each of the second and fourth unit pixels P2 and P4 may include the third and fourth readout circuits RO3 and RO4. Here, the third and fourth readout circuits RO3 and RO4 may be substantially the same as the first and second readout circuits RO1 and RO2, respectively. In this embodiment, a pair of unit pixels adjacent to each other in the first direction D1 or the second direction D2 may constitute the depth pixel of the 4-tap structure described with reference to FIG. 4.

The first and second photogate signals, which have a phase difference of 180° with respect to each other, may be applied to the photogate electrodes of the first and second readout circuits RO1 and RO2, and the third and fourth photogate signals, which have a phase difference of 180° with respect to each other, may be applied to the photogate electrodes of the third and fourth readout circuits RO3 and RO4. Here, the third and fourth photogate signals may have phases different from first and second photogate signals.

In detail, the first and second unit pixels P1 and P2 adjacent to each other in the first direction D1 may be disposed in a mirror-symmetric manner, and the third and fourth unit pixels P3 and P4 adjacent to each other in the first direction D1 may be disposed in a mirror-symmetric manner. The first and fourth unit pixels P1 and P4 adjacent to each other in the second direction D2 may be disposed in a mirror-symmetric manner, and the second and third unit pixels P2 and P3 adjacent to each other in the second direction D2 may be disposed in a mirror-symmetric manner.

Thus, the second readout circuits RO2 of the first and third unit pixels P1 and P3 may be adjacent to each other in a diagonal direction, and the fourth readout circuits RO4 of the second and fourth unit pixels P2 and P4 may be adjacent to each other in a diagonal direction. In addition, the first readout circuits RO1 of the first and third unit pixels P1 and P3 may be adjacent to each other in a diagonal direction, and the third readout circuits RO3 of the second and fourth unit pixels P2 and P4 may be adjacent to each other in a diagonal direction.

In an embodiment, as shown in FIG. 14C, each of the first and second unit pixels P1 and P2 may include the first and second readout circuits RO1 and RO2, and each of the third and fourth unit pixels P3 and P4 may include the third and fourth readout circuits RO3 and RO4.

The first and second unit pixels P1 and P2 adjacent to each other in the first direction D1 may be disposed in a mirror-symmetric manner, and the third and fourth unit pixels P3 and P4 adjacent to each other in the first direction D1 may be disposed in a mirror-symmetric manner.

The second readout circuits RO2 of the first and second unit pixels P1 and P2 may be adjacent to each other in the first direction D1, and the fourth readout circuits RO4 of the third and fourth unit pixels P3 and P4 may be adjacent to each other in the first direction D1. Since the optical sensor blocks, each of which is composed of the first to fourth unit pixels P1-P4, are two-dimensionally arranged, the third readout circuits RO3 of the third and fourth unit pixels P3 and P4 may be adjacent to each other in the first direction D1, and the first readout circuits RO1 of the first and second unit pixels P1 and P2 may be adjacent to each other in the first direction D1.

Figure 15:
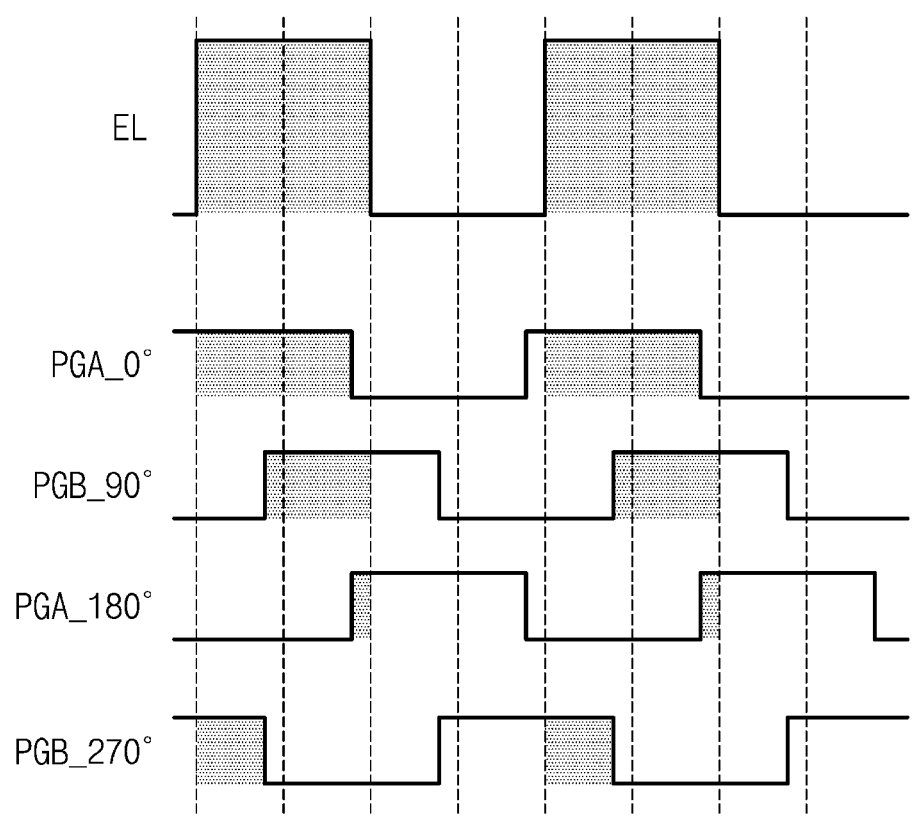
FIG. 15 is a timing diagram illustrating an example operation of the depth pixel in the image sensor shown in FIG. 11.

FIG. 15 is a timing diagram illustrating an operation of the depth pixel in the image sensor shown in FIG. 11.

Referring to FIG. 15, a pulsed optical signal EL may be emitted from the light source 1 to the object O, as shown in FIG. 1. Although each pulse of the optical signal EL is shown in FIG. 4 to have a rectangular waveform, the optical signal EL may be provided in the form of a sinusoidal wave. A fraction of the optical signal EL may be reflected by the object to form a reflected light RL that is incident into the unit pixels P1-P4. The reflected light RL may be delayed, compared with the optical signal EL.

In each unit pixel P1-P4, the first photo control signal PGA_0, which is synchronized with the optical signal EL provided to the object, may be applied to the first photogate electrode PGA, and a second photo control signal PGB_180, which has a phase difference of 180° with respect to the first photo control signal PGA_0, may be applied to the second photogate electrode PGB. The first photo control signal PGA_0 and the second photo control signal PGB_180 may be alternately activated.

Thereafter, a third photo control signal PGA_90, which has a phase difference of 90° with respect to the first photo control signal PGA_0, may be applied to the first photogate electrode PGA, and a fourth photo control signal PGB_270, which has a phase difference of 180° with respect to the third photo control signal PGA_90, may be applied to the second photogate electrode PGB. The third and fourth photogate signals PGA_90 and PGB_270 may be sequentially applied with a specific time gap, after the applying of the first and second photogate signals PGA_0 and PGB_180.

The first and second photo control signals PGA_0 and PGB_180 or the third and fourth photo control signals PGA_90 and PGB_270, which are applied to the first and second photogate electrodes PGA and PGB, may lead to a change in electric potential of the photoelectric conversion region PD.

Photocharges in the first and second floating diffusion nodes FD1 and FD2 may be detected in response to the first and second photo control signals PGA_0 and PGB_180, and then, photocharges in the first and second floating diffusion nodes FD1 and FD2 may be detected in response to the third and fourth photo control signals PGA_90 and PGB_270.

In detail, when a high voltage is applied to the first photogate electrode PGA by the first photo control signal PGA_0, photocharges produced in the photoelectric conversion region PD may be transferred to the first floating diffusion node FD1. Photocharges accumulated in the first floating diffusion node FD1 may be output as a first pixel signal through the first readout circuit RO1. In addition, when a positive voltage is applied to the second photogate electrode PGB by the second photo control signal PGB_180, photocharges produced in the photoelectric conversion region PD may be transferred to the second floating diffusion node FD2. Photocharges accumulated in the second floating diffusion node FD2 may be output as a second pixel signal through the second readout circuit RO2.

An amount of electric charges detected from the first and second floating diffusion nodes FD1 and FD2 may vary depending on how long the reflected optical signal RL is overlapped with the first and second photo control signals PGA-0 and PGB_180.

In detail, a delay time of the reflected light RL may be detected based on a difference between a charge amount, which is measured from the first floating diffusion nodes FD1 during an overlap time of the reflected optical signal RL and the first photo control signal PGA_0, and a charge amount, which is measured from the second floating diffusion nodes FD2 during an overlap time of the reflected optical signal RL and the second photo control signal PGB_180. Thereafter, a delay time of the reflected light RL may be detected based on a difference between a charge amount, which is measured from the first floating diffusion nodes FD1 during an overlap time of the reflected optical signal RL and the first photo control signal PGA_90, and a charge amount, which is measured from the second floating diffusion nodes FD2 during an overlap time of the reflected optical signal RL and the second photo control signal PGB_270. A difference between signals, which are output from the first and second floating diffusion nodes FD1 and FD2, may be detected two times, and the detected signal difference may be used to measure a distance between the light source and the object (i.e., an optical depth).

According to an embodiment of the inventive concept, disclosed are an image sensor, in which a polarizer array and a depth pixel array are stacked, and various arrangements of the polarizer array and the depth pixel array for an easy extraction of polarization information and depth information. Thus, it is possible to estimate a more accurate three-dimensional image.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

While example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
a polarizer array including first to fourth unit pixels arranged in a first direction and a second direction crossing each other, the polarizer array comprising polarization gratings respectively provided in the first to fourth unit pixels, wherein the polarization gratings of the first to fourth unit pixels have polarization directions different from each other; and
a depth pixel array including first to fourth depth pixels corresponding to the first to fourth unit pixels, respectively, each of the first to fourth depth pixels comprising a photoelectric conversion device and first and second readout circuits connected in common to the photoelectric conversion device,
wherein the first and second depth pixels are arranged adjacent to each other in the first direction,
wherein the first readout circuit of the first depth pixel is arranged to be adjacent to the first readout circuit of the second depth pixel, in the first direction,
wherein the first and second depth pixels are disposed adjacent to each other in the first direction,
wherein the first and second readout circuits of the first depth pixel are disposed in a mirror-symmetric manner with the first and second readout circuits of the second depth pixel, in the first direction, and
wherein, in each of the first to fourth depth pixels, the first and second readout circuits are arranged adjacent to each other in a third direction different from the first and second directions.

2. The image sensor of claim 1, wherein each of the first and second readout circuits comprises:
a floating diffusion node; and
a photogate electrode connected between the photoelectric conversion device and the floating diffusion node.

3. The image sensor of claim 2, wherein each of the first and second readout circuits further comprises:
a transfer gate electrode between the photogate electrode and the floating diffusion node; and
a storage gate electrode between the transfer gate electrode and the photogate electrode; and
a capture gate electrode between the photogate electrode and the storage gate electrode.

4. The image sensor of claim 1, further comprising a micro lens array including a plurality of micro lenses corresponding to the first to fourth unit pixels, respectively,
wherein the polarizer array is disposed between the micro lens array and the depth pixel array, when viewed in a sectional view.

5. The image sensor of claim 1, wherein the first to fourth unit pixels comprise first to fourth polarization gratings, respectively,
the first polarization gratings extend parallel to the first direction,
the second polarization gratings extend in a direction at an angle of 45° to the first direction,
the third polarization gratings extend parallel to the second direction,
the fourth polarization gratings extend in a direction at an angle of 135° to the first direction, and
the first to fourth unit pixels are sequentially arranged in a clockwise direction.

6. The image sensor of claim 1, wherein each of the first and second readout circuits comprises:
a floating diffusion node; and
a photogate electrode connected between the photoelectric conversion device and the floating diffusion node, and
wherein the photogate electrodes of the first and second readout circuits are connected in common to each photoelectric conversion device.

7. An image sensor, comprising:
a polarizer array including first to fourth unit pixels arranged in a first direction and a second direction crossing each other, the polarizer array comprising polarization gratings respectively provided in the first to fourth unit pixels, wherein the polarization gratings of the first to fourth unit pixels have polarization directions different from each other; and
a depth pixel array including first to fourth depth pixels corresponding to the first to fourth unit pixels, respectively, each of the first to fourth depth pixels comprising a photoelectric conversion device and first and second readout circuits connected in common to the photoelectric conversion device,
wherein the first and second depth pixels are arranged adjacent to each other in the first direction,
wherein the first readout circuit of the first depth pixel is arranged to be adjacent to the first readout circuit of the second depth pixel, in the first direction,
wherein each of the first to fourth depth pixels of the depth pixel array further comprises third and fourth readout circuits sharing the photoelectric conversion device,
wherein the first to fourth readout circuits of the first depth pixel and the first to fourth readout circuits of the second depth pixel are disposed in a mirror-symmetric manner with respect to a line parallel to the second direction, and
wherein the first to fourth readout circuits of the first and second depth pixels and the first to fourth readout circuits of the third and fourth depth pixels are disposed in a mirror-symmetric manner with respect to a line parallel to the first direction.

8. The image sensor of claim 7, wherein each of the third and fourth readout circuits comprises:
a floating diffusion node; and
a photogate electrode connected between the photoelectric conversion device and the floating diffusion node.

9. An image sensor, comprising:
a polarizer array comprising first to fourth unit pixels, which are two-dimensionally arranged, and comprising polarization gratings, which are respectively provided in the first to fourth unit pixels and have polarization directions different from each other;
a depth pixel array including first to fourth depth pixels corresponding to the first to fourth unit pixels, respectively, each of the first to fourth depth pixels comprising a photoelectric conversion device and first to fourth readout circuits connected to the photoelectric conversion device; and
a micro lens array comprising micro lenses corresponding to the first to fourth unit pixels, respectively,
wherein the polarizer array is disposed between the micro lens array and the depth pixel array,
wherein the first and second depth pixels are disposed adjacent to each other in a first direction,
wherein the first readout circuit of the first depth pixel is arranged to be adjacent to the first readout circuit of the second depth pixel, in the first direction, wherein the first to fourth unit pixels are sequentially disposed in a clockwise direction to constitute a single optical sensor block, wherein a plurality of the optical sensor blocks are two-dimensionally arranged in the first direction and a second direction crossing the first direction, wherein the first to fourth readout circuits of the first depth pixel and the first to fourth readout circuits of the second depth pixel are disposed in a mirror-symmetric manner with respect to a line parallel to the first direction, and wherein the first to fourth readout circuits of the first and second depth pixels and the first to fourth readout circuits of the third and fourth depth pixels are disposed in a mirror-symmetric manner with respect to a line parallel to the second direction.

* * * * *